US012696633B2

(12) United States Patent
Kim

(10) Patent No.: US 12,696,633 B2
(45) Date of Patent: Jul. 28, 2026

(54) DISPLAY DEVICE

(71) Applicant: Samsung Display Co., LTD., Yongin-si
(KR)

(72) Inventor: Deokhoi Kim, Seongnam-si (KR)

(73) Assignee: Samsung Display Co., Ltd.,
Gyeonggi-do (KR)

( * ) Notice: Subject to any disclaimer, the term of this
patent is extended or adjusted under 35
U.S.C. 154(b) by 564 days.

(21) Appl. No.: 17/569,445

(22) Filed: Jan. 5, 2022

(65) Prior Publication Data

US 2022/0302239 A1 Sep. 22, 2022

(30) Foreign Application Priority Data

Mar. 18, 2021 (KR) ......................... 10-2021-0035456

(51) Int. Cl.
*H10K 59/126* (2023.01)
*H10K 59/65* (2023.01)
*H10K 59/80* (2023.01)

(52) U.S. Cl.
CPC ....... *H10K 59/126* (2023.02); *H10K 59/8731*
(2023.02); *H10K 59/65* (2023.02)

(58) Field of Classification Search
CPC ............... H01L 59/1213; H01L 59/121; H01L
59/1216; H01L 59/126; H01L 59/8731;
H01L 27/1255; H01L 27/12; H01L
27/1214; H01L 27/1218; H01L 29/78633;
H10K 2102/311; H10K 77/111; H10K
50/8445; H10K 59/1213; H10K 59/121;
H10K 59/1216; H10K 59/126; H10K
59/8731; H10K 59/00; H10K 59/123;
(Continued)

(56) References Cited

U.S. PATENT DOCUMENTS 6,621,103 B2 * 9/2003 Yamada ............ H01L 29/78603
257/350
8,441,606 B2 * 5/2013 Nakagawa .......... H01L 27/1214
349/111
(Continued)

FOREIGN PATENT DOCUMENTS

CN 109817645 5/2019
KR 20170049705 A 5/2017
(Continued)

OTHER PUBLICATIONS

Office Action for Korean Application No. 10-2021-0035456 dated
Jul. 25, 2025.

*Primary Examiner* — Sophia T Nguyen
(74) *Attorney, Agent, or Firm* — Harness, Dickey &
Pierce, P.L.C.

(57) ABSTRACT

A display device including a substrate, a buffer layer, an
amorphous silicon layer, a first light blocking layer, a driving
transistor, an upper capacitor electrode, a first switching
transistor, a lower electrode, a light emitting layer, and an
upper electrode. The driving transistor is disposed on a
buffer layer under which a first light blocking layer is located
and includes a first active layer including polysilicon and a
first gate electrode disposed on the first active layer. An
upper capacitor electrode is disposed on the first gate
electrode and includes a metal oxide semiconductor. The
upper capacitor electrode constitutes a capacitor together
with the first gate electrode.

16 Claims, 14 Drawing Sheets

(58) Field of Classification Search

CPC .... H10K 59/124; H10D 86/481; H10D 86/80; H10D 86/60; H10D 86/40; H10D 86/425; H10D 86/471; H10D 86/421; H10D 1/60; H10D 1/66

See application file for complete search history.

(56) References Cited

U.S. PATENT DOCUMENTS

| | | | | |
|---|---|---|---|---|
| 8,809,873 | B2 * | 8/2014 | Chung | H10K 59/8792 |
| | | | | 257/79 |
| 9,716,134 | B2 * | 7/2017 | Lin | H01L 29/78675 |
| 10,236,308 | B2 * | 3/2019 | Lee | H01L 29/78618 |
| 10,332,446 | B2 * | 6/2019 | Chen | H10D 86/423 |
| 10,943,970 | B2 | 3/2021 | Jo et al. | |
| 10,978,499 | B2 | 4/2021 | Jang et al. | |
| 10,978,538 | B2 * | 4/2021 | Wang | H10D 30/6723 |
| 11,289,561 | B2 * | 3/2022 | Kang | H10K 59/1216 |
| 11,342,401 | B2 * | 5/2022 | Choi | H10K 59/123 |
| 11,417,686 | B2 * | 8/2022 | Kwon | H10K 77/10 |
| 11,871,596 | B2 * | 1/2024 | Kim | H10K 77/10 |
| 12,022,710 | B2 * | 6/2024 | Lee | H10D 86/471 |
| 12,048,208 | B2 * | 7/2024 | Wang | H01L 27/1255 |
| 12,150,344 | B2 * | 11/2024 | Kim | H10K 59/1213 |
| 2006/0246360 | A1 * | 11/2006 | Hwang | H01L 27/1288 |
| | | | | 257/E27.111 |
| 2010/0182223 | A1 * | 7/2010 | Choi | G09G 3/3233 |
| | | | | 345/76 |
| 2013/0176195 | A1 * | 7/2013 | Kim | H10K 59/1216 |
| | | | | 345/82 |
| 2015/0053935 | A1 * | 2/2015 | Gupta | G09G 3/3225 |
| | | | | 257/43 |
| 2015/0102343 | A1 * | 4/2015 | Park | H10D 86/441 |
| | | | | 438/151 |
| 2015/0123084 | A1 * | 5/2015 | Kim | H10K 59/121 |
| | | | | 257/43 |
| 2015/0243685 | A1 * | 8/2015 | Lee | H01L 27/1248 |
| | | | | 257/43 |
| 2015/0364527 | A1 * | 12/2015 | Wang | H10K 59/12 |
| | | | | 257/40 |
| 2016/0005803 | A1 * | 1/2016 | Ryu | H10K 50/844 |
| | | | | 257/40 |
| 2016/0063924 | A1 * | 3/2016 | Oh | H10D 86/451 |
| | | | | 345/83 |
| 2016/0190221 | A1 * | 6/2016 | Cho | H10D 86/481 |
| | | | | 257/40 |
| 2016/0204172 | A1 * | 7/2016 | Park | H10D 86/427 |
| | | | | 257/40 |
| 2016/0210905 | A1 * | 7/2016 | Lee | H10D 86/60 |
| 2017/0092709 | A1 * | 3/2017 | Choi | H10K 77/111 |
| 2017/0117343 | A1 * | 4/2017 | Oh | H10K 59/1213 |
| 2017/0162606 | A1 * | 6/2017 | Yan | H01L 27/1248 |
| 2017/0330927 | A1 * | 11/2017 | Lee | H10K 59/1213 |
| 2017/0338252 | A1 * | 11/2017 | Lee | H10K 59/1213 |
| 2018/0033849 | A1 * | 2/2018 | Noh | H01L 27/124 |
| 2018/0061921 | A1 * | 3/2018 | Son | G09G 3/3225 |
| 2018/0069190 | A1 * | 3/2018 | Kim | H10D 86/60 |
| 2018/0097016 | A1 * | 4/2018 | Yang | H01L 27/1222 |
| 2018/0151654 | A1 * | 5/2018 | Lee | H10K 59/1216 |
| 2018/0166015 | A1 * | 6/2018 | Beak | H10K 59/1213 |
| 2018/0233575 | A1 * | 8/2018 | Kim | H10D 30/0321 |
| 2018/0286936 | A1 * | 10/2018 | Lee | H01L 29/78633 |
| 2018/0350891 | A1 * | 12/2018 | Kim | G09G 3/3233 |
| 2018/0366586 | A1 * | 12/2018 | Son | H01L 27/1218 |
| 2019/0081090 | A1 * | 3/2019 | Lee | H01L 27/1255 |
| 2019/0189723 | A1 * | 6/2019 | Kim | H10K 77/111 |
| 2019/0196635 | A1 * | 6/2019 | Park | H10K 59/879 |
| 2019/0204668 | A1 * | 7/2019 | Yang | G02F 1/133514 |
| 2019/0206972 | A1 * | 7/2019 | Park | H10K 59/126 |
| 2019/0214447 | A1 * | 7/2019 | Kim | H10K 59/1216 |
| 2019/0280076 | A1 * | 9/2019 | Bang | H10K 59/131 |
| 2019/0288048 | A1 * | 9/2019 | Kang | H10K 59/1216 |
| 2019/0305065 | A1 * | 10/2019 | Kim | H10K 59/131 |
| 2019/0319212 | A1 * | 10/2019 | Park | H10K 59/121 |
| 2019/0326543 | A1 * | 10/2019 | Kim | H10D 86/60 |
| 2019/0333971 | A1 * | 10/2019 | Kishimoto | G06F 3/0412 |
| 2019/0355799 | A1 * | 11/2019 | Jeong | H10K 59/124 |
| 2019/0377925 | A1 * | 12/2019 | Bae | H10K 50/8426 |
| 2019/0393291 | A1 * | 12/2019 | Jeon | H10K 59/131 |
| 2020/0065542 | A1 * | 2/2020 | Jin | H01L 24/26 |
| 2020/0066765 | A1 * | 2/2020 | Cho | H10D 86/411 |
| 2020/0083309 | A1 * | 3/2020 | Wang | H10K 59/126 |
| 2020/0083311 | A1 * | 3/2020 | Cha | H10K 59/80522 |
| 2020/0091252 | A1 * | 3/2020 | Bang | H10K 59/40 |
| 2020/0105850 | A1 * | 4/2020 | Kang | H10K 59/124 |
| 2020/0152663 | A1 * | 5/2020 | Li | H01L 27/124 |
| 2020/0194529 | A1 * | 6/2020 | Lee | H01L 28/60 |
| 2020/0243635 | A1 * | 7/2020 | Lee | H01L 27/1237 |
| 2020/0265789 | A1 * | 8/2020 | Park | H01L 29/7869 |
| 2020/0273927 | A1 | 8/2020 | Oh et al. | |
| 2020/0295110 | A1 * | 9/2020 | Lee | H10K 59/124 |
| 2020/0395425 | A1 * | 12/2020 | Han | H10K 59/126 |
| 2020/0403055 | A1 * | 12/2020 | Jung | H10K 59/131 |
| 2021/0020724 | A1 * | 1/2021 | Cho | H10K 59/131 |
| 2021/0066421 | A1 * | 3/2021 | Son | H01L 27/1237 |
| 2021/0118963 | A1 * | 4/2021 | Bang | H10K 59/40 |
| 2021/0175311 | A1 * | 6/2021 | Kwak | G09G 3/3233 |
| 2021/0193788 | A1 * | 6/2021 | Jo | H10K 59/131 |
| 2021/0217835 | A1 * | 7/2021 | Park | H10K 59/8723 |
| 2021/0225972 | A1 * | 7/2021 | Qu | H10D 86/425 |
| 2021/0280613 | A1 * | 9/2021 | Kwon | H10D 86/423 |
| 2021/0359063 | A1 * | 11/2021 | Lu | H01L 27/1225 |
| 2021/0359066 | A1 * | 11/2021 | An | H01L 27/124 |
| 2022/0005904 | A1 * | 1/2022 | Moon | H01L 29/7869 |
| 2022/0020836 | A1 * | 1/2022 | Gong | H10K 71/00 |
| 2022/0115488 | A1 * | 4/2022 | Shin | H10K 59/8731 |
| 2022/0190079 | A1 * | 6/2022 | Noh | H10D 86/451 |
| 2022/0208911 | A1 * | 6/2022 | Cho | H10K 59/123 |
| 2022/0246687 | A1 * | 8/2022 | Lee | H10D 86/423 |
| 2022/0302239 | A1 * | 9/2022 | Kim | H10K 59/65 |
| 2022/0336564 | A1 * | 10/2022 | An | H10K 59/121 |
| 2023/0013848 | A1 * | 1/2023 | Shi | H10K 59/1213 |
| 2023/0065335 | A1 * | 3/2023 | Kim | H01L 29/7869 |
| 2023/0157088 | A1 * | 5/2023 | Park | H10K 59/124 |
| | | | | 257/71 |
| 2023/0170357 | A1 * | 6/2023 | Lius | H01L 27/1251 |
| | | | | 257/43 |
| 2023/0209884 | A1 * | 6/2023 | Shim | H01L 27/1255 |
| | | | | 257/40 |
| 2023/0360605 | A1 * | 11/2023 | Kim | H03K 17/6872 |
| 2023/0371313 | A1 * | 11/2023 | Masataka | H10K 59/1201 |
| 2024/0013727 | A1 * | 1/2024 | Zhang | G09G 3/20 |
| 2024/0206252 | A1 * | 6/2024 | Li | H10K 59/131 |
| 2024/0224631 | A1 * | 7/2024 | Yeon | H10K 59/131 |
| 2024/0260317 | A1 * | 8/2024 | Lim | H10K 59/123 |
| 2024/0312998 | A1 * | 9/2024 | Seo | H10D 86/60 |
| 2024/0334770 | A1 * | 10/2024 | Chen | H10K 59/131 |
| 2025/0040365 | A1 * | 1/2025 | Lee | H10K 59/1216 |
| 2025/0072218 | A1 * | 2/2025 | Kang | H10K 59/131 |
| 2025/0169284 | A1 * | 5/2025 | Yoon | H10D 86/60 |
| 2025/0185464 | A1 * | 6/2025 | Noh | H10D 86/451 |
| 2025/0318344 | A1 * | 10/2025 | Kim | H10H 29/24 |

FOREIGN PATENT DOCUMENTS

| | | |
|---|---|---|
| KR | 20190139753 A | 12/2019 |
| KR | 10-2062912 | 2/2020 |
| KR | 20200029103 A | 3/2020 |
| KR | 10-2020-0040965 | 4/2020 |
| KR | 10-2020-0079894 | 7/2020 |
| KR | 20200102580 A | 9/2020 |

* cited by examiner

DISPLAY DEVICE

CROSS-REFERENCE TO RELATED APPLICATION

This application claims priority from and the benefit of Korean Patent Application No. 10-2021-0035456, filed on Mar. 18, 2021, which is hereby incorporated by reference for all purposes as if fully set forth herein.

BACKGROUND

Field

Embodiments of the invention relate generally to a display device. More particularly, embodiments of the inventive concepts relate to a display device including a functional module.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting diode display device.

To display a video (or an image) on a top surface of a display device, the display device may include: a display area in which a light emitting structure is disposed; and a non-display area in which a gate driver, a data driver, wires, a functional module (e.g., a camera module, a face recognition sensor module, a pupil recognition sensor module, a proximity sensor module, a motion detection sensor module, an infrared sensor module, an illuminance sensor module, a fingerprint recognition sensor module, etc.), and the like are disposed. Recently, in order to reduce a size of the non-display area, a display device in which a functional module is disposed on a bottom surface of a lower substrate included in the display device to overlap one portion of the display area has been developed. In other words, the functional module may overlap the display area, and an image may be displayed on a top surface of the display device overlapping a portion where the functional module is disposed.

The above information disclosed in this Background section is only for understanding of the background of the inventive concepts, and, therefore, it may contain information that does not constitute prior art.

SUMMARY

Embodiments of the present invention provide a display device including a functional module.

Additional features of the inventive concepts will be set forth in the description which follows, and in part will be apparent from the description, or may be learned by practice of the inventive concepts.

An embodiment of the present invention provides a display device including a substrate, a buffer layer, an amorphous silicon layer, a first light blocking layer, a driving transistor, an upper capacitor electrode, a first switching transistor, a lower electrode, a light emitting layer, and an upper electrode. The substrate includes a first polyimide layer, a first barrier layer, a second polyimide layer, and a second barrier layer, which are sequentially stacked. The buffer layer is disposed on the substrate. The amorphous silicon layer is disposed between the first barrier layer and the second polyimide layer. The first light blocking layer is disposed between the second polyimide layer and the second barrier layer. The driving transistor is disposed on the buffer layer under which the first light blocking layer is located, and includes a first active layer including polysilicon and a first gate electrode disposed on the first active layer. The upper capacitor electrode is disposed on the first gate electrode, and includes a metal oxide semiconductor. The upper capacitor electrode constitutes a capacitor together with the first gate electrode. The first switching transistor includes a second active layer including a metal oxide semiconductor and a second gate electrode disposed on the second active layer. The lower electrode is disposed on the driving transistor and the first switching transistor. The light emitting layer is disposed on the lower electrode. The upper electrode is disposed on the light emitting layer.

The upper capacitor electrode and the second active layer may be located on a same layer and may include a same material.

The upper capacitor electrode may include an opening that overlaps at least a part of the first gate electrode.

The display device may further include an interlayer insulating layer disposed on the upper capacitor electrode, a first power supply electrode disposed on the interlayer insulating layer, and a second power supply electrode spaced apart from the first power supply electrode.

The first power supply electrode may be connected to the first gate electrode through a first contact hole formed in a first portion of the interlayer insulating layer and passing through the opening of the upper capacitor electrode, and the second power supply electrode may be connected to the upper capacitor electrode through a second contact hole formed in a second portion of the interlayer insulating layer.

The display device may further include a lower gate electrode disposed under the second active layer, and overlapping the second gate electrode.

The lower gate electrode and the first gate electrode may be located on a same layer, and may include a same material.

The substrate may include a first display area, a second display area spaced apart from the first display area, and a third display area surrounding the first and second display areas.

The display device may further include a lower structure disposed on a bottom surface of the substrate. The lower structure may include first and second openings formed at portions overlapping the first and second display areas, respectively.

The first and second openings may expose the bottom surface of the substrate overlapping the first and second display areas, respectively.

The lower structure may include an impact absorption layer, a heat dissipation plate, and an adhesive layer.

The display device may further include a first functional module disposed in the first opening of the lower structure and a second functional module disposed in the second opening of the lower structure.

The first functional module may include one selected from a camera module, a face recognition sensor module, a pupil recognition sensor module, an acceleration sensor module, a geomagnetic sensor module, a proximity sensor module, an infrared sensor module, and an illuminance sensor module.

The second functional module may include a fingerprint recognition sensor module.

The display device may further include a second light blocking layer disposed between the second polyimide layer and the second barrier layer while being spaced apart from the first light blocking layer and a second switching transistor including a third active layer disposed on the second light blocking layer and a third gate electrode disposed on the third active layer.

The display device may further include a planarization layer disposed on the first and second switching transistors and the driving transistor.

The lower electrode may be connected to the second switching transistor through a contact hole formed in the planarization layer.

The third active layer and the first active layer may be located on a same layer, and may include a same material.

The third gate electrode and the first gate electrode may be located on a same layer and may include a same material.

The display device may further include a thin film encapsulation structure disposed on the upper electrode. The thin film encapsulation structure may include a first inorganic thin film encapsulation layer, an organic thin film encapsulation layer disposed on the first inorganic thin film encapsulation layer, and a second inorganic thin film encapsulation layer disposed on the organic thin film encapsulation layer.

Since the display device according to the inventive concepts includes the capacitor including the upper capacitor electrode including a metal oxide semiconductor and the first gate electrode, the display device including the first light blocking layer and the second light blocking layer may be provided through a total of 13 mask processes without adding a mask process. Accordingly, the display device may include the first light blocking layer and the second light blocking layer, so that the driving transistor may not be influenced by the polarization, and a failure of the driving transistor may be prevented. In addition, since the mask process is not added, a manufacturing cost of the display device may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 6, 7, 8, 9, 10, 11, 12, 13, 14, 15, and 16 are cross-sectional views showing a method of manufacturing a display device according to embodiments of the present invention.

DETAILED DESCRIPTION

Figure 1:
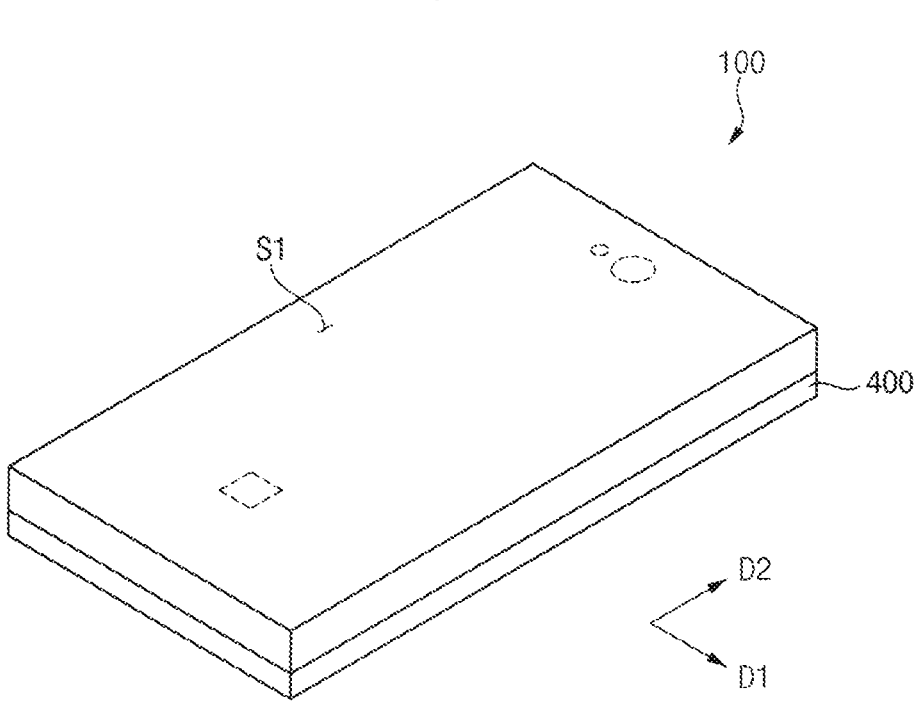
FIGS. 1 and 2 are perspective views showing a display device according to embodiments of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
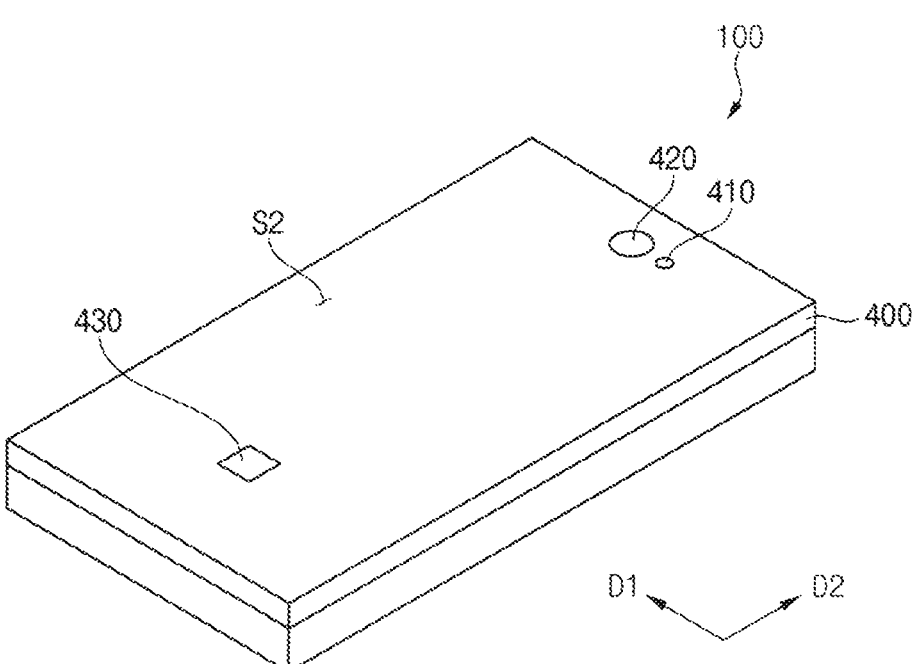
Figure 3:
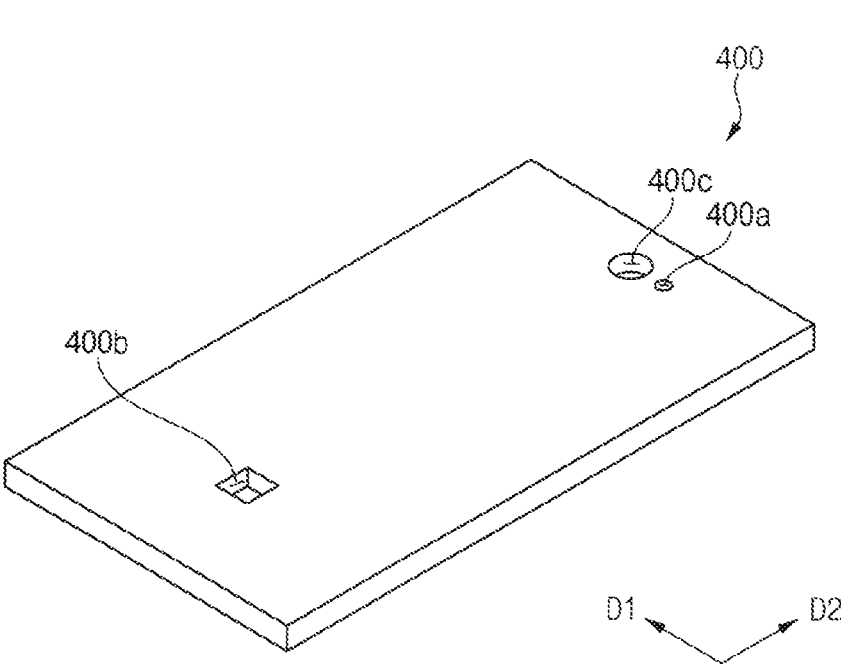
FIG. 3 is a perspective view showing a lower structure included in the display device of FIG. 1.
Figure 4:
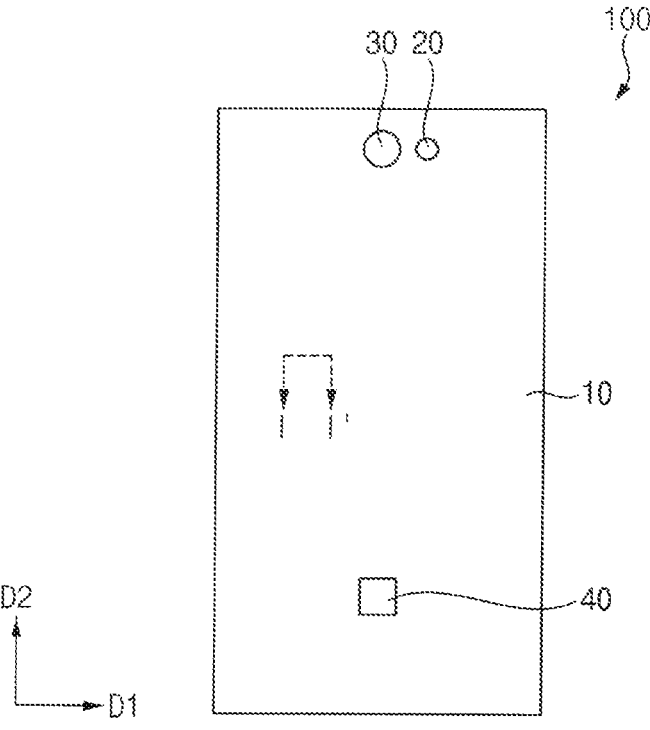
FIG. 4 is a plan view showing first to fourth display areas included in the display device of FIG. 1.

FIGS. 1 and 2 are perspective views showing a display device according to embodiments of the present disclosure, and FIG. 3 is a perspective view showing a lower structure included in the display device of FIG. 1. FIG. 4 is a plan view showing first to fourth display areas included in the display device of FIG. 1.

Referring to FIGS. 1, 2, 3, and 4, a display device 100 may include a first display area 20, a second display area 40, a third display area 30, and a fourth display area 10. In this case, the fourth display area 10 may at least partially surround each of the first display area 20, the second display area 40, and the third display area 30. For example, the fourth display area 10 may completely surround the first display area 20, the second display area 40, and the third display area 30. In addition, each of the first display area 20 and the third display area 30 may have a circular shape when viewed in a plan view, and each of the second display area 40 and the fourth display area 10 may have a rectangular shape when viewed in a plan view. However, the shape of each of the first display area 20, the second display area 40, the third display area 30, and the fourth display area 10 is not limited thereto.

The display device 100 may include a lower structure 400, a first functional module 410, a second functional module 430, and a third functional module 420. In addition, the display device 100 may be divided into a first surface S1 and a second surface S2. The first surface S1 may correspond to a surface on which an image is displayed, and the second surface S2 may correspond to a surface on which the image is not displayed. In this case, the second surface S2 may correspond to a bottom surface of the lower structure 400.

The lower structure 400 may be disposed on a bottom surface of the substrate 110 (see FIG. 5) included in the display device 100, which will be described below. As shown in FIG. 3, the lower structure 400 may include a first opening 400a, a second opening 400b, and a third opening 400c. The first opening 400a may overlap the first display area 20, the second opening 400b may overlap the second display area 40, and the third opening 400c may overlap the third display area 30. For example, the first opening 400a may expose the bottom surface of the substrate 110 overlapping the first display area 20, the second opening 400b may expose the bottom surface of the substrate 110 overlapping the second display area 40, and the third opening 400c may expose the bottom surface of the substrate 110 overlapping the third display area 30. In addition, each of the first opening 400a and the third opening 400c may have a circular shape when viewed in a plan view, and the second opening 400b may have a rectangular shape when viewed in a plan view. However, the shape of each of the first opening 400a, the second opening 400b, and the third opening 400c is not limited thereto.

The lower structure 400 may have a multilayer structure. For example, the lower structure 400 may include an impact absorption layer disposed on the bottom surface of the substrate 110, a heat dissipation plate disposed under the impact absorption layer, an adhesive layer disposed between the impact absorption layer and the heat dissipation plate, and the like.

The impact absorption layer may protect the bottom surface of the substrate 110 from an external impact. For example, the impact absorption layer may include a foam-type material such as polyurethane foam and polystyrene foam.

The heat dissipation plate may dissipate heat transferred to the bottom surface of the substrate 110. For example, the heat dissipation plate may include aluminum (Al), an aluminum-containing alloy, silver (Ag), a silver-containing alloy, tungsten (W), copper (Cu), a copper-containing alloy, nickel (Ni), chromium (Cr), molybdenum (Mo), a molybdenum-containing alloy, titanium (Ti), platinum (Pt), tantalum (Ta), neodymium (Nd), scandium (Sc), and the like.

The adhesive layer may bond the impact absorption layer to the heat dissipation plate. For example, the adhesive layer may include an optical-clear adhesive (OCA), a pressure-sensitive adhesive (PSA), and the like.

Referring again to FIGS. 1 to 4, the first functional module 410 may be disposed in the first opening 400a of the lower structure 400, the second functional module 430 may be disposed in the second opening 400b of the lower structure 400, and the third functional module 420 may be disposed in the third opening 400c of the lower structure 400.

However, although the first to third openings 400a, 400b, and 400c have been shown in FIG. 2 as being completely filled with the first to third functional modules 410, 430, and 420, respectively, the configurations of the inventive concepts are not limited thereto. For example, the first to third functional modules 410, 430, and 420 may be disposed only in at least parts of the first to third openings 400a, 400b, and 400c, respectively.

In addition, although FIG. 2 shows that each of the first and third functional modules 410 and 420 has a circular shape when viewed in a plan view, and the second functional module 430 has a rectangular shape when viewed in a plan view, the shape of each of the first to third functional modules 410, 430, and 420 is not limited thereto. For example, when the first to third functional modules 410, 430, and 420 are disposed only in at least parts of the first to third openings 400a, 400b, and 400c, respectively, the first to third functional modules 410, 430, and 420 may have various shapes.

The first to third functional modules 410, 430, and 420 may include: a camera module for capturing (or recognizing) an image of an object located over the first surface S1 of the display device 100; a face recognition sensor module configured to detect a face of a user; a pupil recognition sensor module configured to detect a pupil of the user; an acceleration sensor module and a geomagnetic sensor module configured to determine a movement of the display device 100; a proximity sensor module and an infrared sensor module configured to detect proximity with respect to the object or the user located over the first surface S1 of the display device 100; a luminance sensor module configured to measure a degree of brightness when left in a pocket or a bag; a fingerprint recognition sensor module configured to recognize a fingerprint of the user making contact with the first surface S1 of the display device 100; and the like.

In embodiments, the first functional module 410 may be a proximity sensor module or an infrared sensor module. For example, the proximity sensor module or the infrared sensor module may detect proximity with respect to a front side of the display device 100 by radiating infrared rays from the first surface S1 of the display device 100 and detecting reflected infrared rays. In addition, the second functional module 430 may be a fingerprint recognition sensor module. For example, the fingerprint recognition sensor module may recognize a fingerprint of a user by radiating infrared rays to the fingerprint of the user, which makes contact with the first surface S1 overlapping the second display area 40, and detecting reflected infrared rays. Moreover, the third functional module 420 may be a camera module. For example, the camera module may capture an image by collecting an external light incident onto the first surface S1 overlapping the third display area 30.

In the embodiments, the first display area 20, the second display area 40, the third display area 30, and the fourth display area 10 on the first surface S1 may all be areas in which an image is displayed. In other embodiments, on the first surface S1, the first display area 20, the second display area 40, and the fourth display area 10 may be areas in which an image is displayed, and the third display area 30 may be an area in which the image is not displayed. For example, the camera module may overlap the third display area 30, and in order to prevent an image acquired from the camera module from being distorted, the image may not be displayed in the third display area 30.

However, although the display device 100 has been shown as having a rectangular shape when viewed in a plan view, the shape of the display device 100 is not limited thereto. For example, the display device 100 may have a triangular shape, a rhombic shape, a polygonal shape, a track shape, a circular shape, or an elliptical shape when viewed in a plan view.

Figure 5:
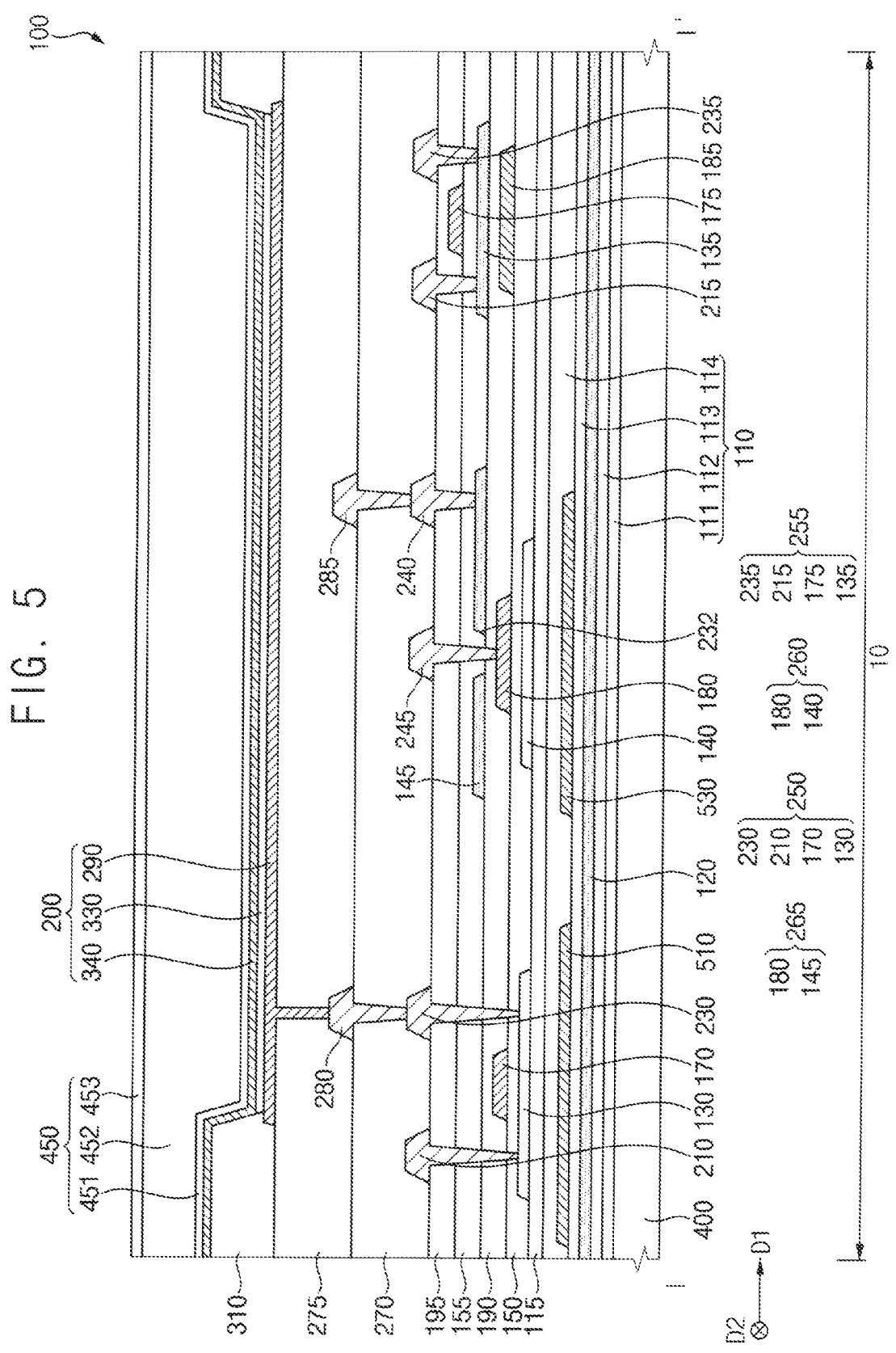
FIG. 5 is a cross-sectional view taken along line I-I' of FIG. 4.

FIG. 5 is a cross-sectional view taken along line I-I' of FIG. 4.

Referring to FIGS. 2 and 5, the display device 100 may include a first functional module 410, a second functional module 430, a third functional module 420, a lower structure 400, a substrate 110, a silicon layer 120 (e.g., an amorphous silicon layer), a first light blocking layer 530, a second light blocking layer 510, a buffer layer 115, a driving transistor 260, a capacitor 265, a first switching transistor 255, a second switching transistor 250, a lower gate electrode 185, a first gate insulating layer 150, a first interlayer insulating layer 190, a second gate insulating layer 155, a second interlayer insulating layer 195, a first power supply electrode 245, a second power supply electrode 240, a power supply wire 285, a connection electrode 280, a first planarization layer 270, a second planarization layer 275, a light emitting structure 200, a pixel defining layer 310, a thin film encapsulation layer 450, and the like. In this case, the substrate 110 may include a first organic layer 111 (e.g., a first polyimide layer), a first inorganic layer 112 (e.g., a first barrier layer), a second organic layer 113 (e.g., a second polyimide layer), and a second inorganic layer 114 (e.g., a second barrier layer), and the driving transistor 260 may include a first active layer 140, a first gate electrode 180, a first source electrode, and a first drain electrode. The first switching transistor 255 may include a second active layer 135, a second gate electrode 175, a second source electrode 215, and a second drain electrode 235, and the second switching transistor 250 may include a third active layer 130, a third gate electrode 170, a third source electrode 210, and a third drain electrode 230. Moreover, the light emitting structure 200 may include a lower electrode 290, a light emitting layer 330, and an upper electrode 340, and the thin film encapsulation layer 450 may include a first inorganic thin film encapsulation layer 451, an organic thin film encapsulation layer 452, and a second inorganic thin film encapsulation layer 453. In the embodiments, the capacitor 265 may include a first gate electrode 180 and an upper capacitor electrode 145. In this case, the first gate electrode 180 may function as a gate electrode of the driving transistor 260, or may function as a lower capacitor electrode of the capacitor 265.

The first organic layer 111 may be provided. The first organic layer 111 may include an organic material having flexibility. For example, the first organic layer 111 may include a random copolymer or a block copolymer. In addition, the first organic layer 111 may have high transparency, a low coefficient of thermal expansion, and a high glass transition temperature. The first organic layer 111 may include an imide group, so that the first organic layer 111 may have an excellent heat resistance, an excellent chemical resistance, an excellent abrasion resistance, and excellent electrical properties. In the embodiments, the first organic layer 111 may include polyimide.

The first inorganic layer 112 may be disposed on the first organic layer 111. In other words, a top surface of the first organic layer 111 and a bottom surface of the first inorganic layer 112 may make direct contact with each other, and the first inorganic layer 112 may be disposed over the whole first organic layer 111. The first inorganic layer 112 may block moisture penetrating through the first organic layer 111. The first inorganic layer 112 may include an inorganic material having flexibility. In the embodiments, the first inorganic layer 112 may include a silicon compound, metal oxide, or the like. For example, the first inorganic layer 112 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like.

The silicon layer 120 may be disposed on the first inorganic layer 112. The silicon layer 120 may bond the first inorganic layer 112 to the second organic layer 113. In other words, a bottom surface of the silicon layer 120 may make direct contact with the first inorganic layer 112, a top surface of the silicon layer 120 may make direct contact with the second organic layer 113, and the silicon layer 120 may be disposed over the whole of the first inorganic layer 112 and the second organic layer 113 between the first inorganic layer 112 and the second organic layer 113. The silicon layer 120 may include a silicon material having an adhesive function. In the embodiments, the silicon layer 120 may include amorphous silicon (e.g., non-crystalline silicon).

The second organic layer 113 may be disposed on the silicon layer 120. In other words, the second organic layer 113 may be disposed over the whole silicon layer 120. The second organic layer 113 may include an organic material having flexibility. For example, the second organic layer 113 may include a random copolymer or a block copolymer. In the embodiments, the second organic layer 113 may include the same material as the first organic layer 111.

The first light blocking layer 530 may be disposed on the second organic layer 113. In other words, the first light blocking layer 530 may overlap the driving transistor 260 between the second organic layer 113 and the second inorganic layer 114. In some embodiments, the first light blocking layer 530 may overlap the driving transistor 260 between the substrate 110 and the buffer layer 115.

The first light blocking layer 530 may prevent the second organic layer 113 from being charged to accumulate charges under the first active layer 140 of the driving transistor 260. For example, infrared rays may be emitted when the first functional module 410 and the second functional module 430 are driven. The infrared rays may cause polarization (e.g., charging) in the second organic layer 113, and an electron-hole pair (EHP) may be generated in the silicon layer 120 by the infrared rays, so that the polarization may be accelerated. In addition, an electric field may be formed by a voltage difference between signals applied to switching transistors adjacent to the driving transistor 260. In this case, the charges may be accumulated under the first active layer 140, so that driving of the driving transistor 260 may be obstructed, and an edge portion of each of the first display area 20 and the second display area 40 may be visually recognized as being relatively bright. In addition, when a light emitted from the light emitting layer 330 is reflected from the upper electrode 340, the thin film encapsulation layer 450, and the like so as to be incident onto the substrate 110, the light may cause the polarization.

Since the first light blocking layer 530 is disposed under the first active layer 140, the first light blocking layer 530 may assist in accurately driving the driving transistor 260. In the embodiments, in another sectional view of the display device 100, the first light blocking layer 530 may be connected to the power supply wire so that a constant voltage may be applied to the first light blocking layer 530. In other embodiments, the first light blocking layer 530 may be connected to the first gate electrode 180, or may be grounded.

In some embodiments, a light (e.g., an external light) incident from an outside of the display device 100 may penetrate into the third display area 30 in which the third functional module 420 is located, and the external light may cause the polarization. In this case, an edge portion of the third display area 30 may be visually recognized as being relatively bright.

The first light blocking layer 530 may include a metal, an alloy, metal nitride, conductive metal oxide, a transparent conductive material, and the like. For example, the first light blocking layer 530 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other embodiments, the first light blocking layer 530 may have a multilayer structure including a plurality of metal layers. The metal layers may include mutually different materials, and may have mutually different thicknesses.

The second light blocking layer 510 may be disposed on the second organic layer 113 while being spaced apart from the first light blocking layer 530. In other words, the second light blocking layer 510 may overlap the second switching transistor 250 between the second organic layer 113 and the second inorganic layer 114. In some embodiments, the second light blocking layer 510 may overlap the second switching transistor 250 between the substrate 110 and the buffer layer 115.

The second light blocking layer 510 may prevent the second organic layer 113 from being charged to accumulate charges under the third active layer 130 of the second switching transistor 250. In other words, the second light blocking layer 510 may have the same function as the first light blocking layer 530. The second light blocking layer 510 and the first light blocking layer 530 may be located on the same layer, and may include the same material. In the embodiments, in another sectional view of the display device 100, the second light blocking layer 510 may be connected to the power supply wire so that a constant voltage may be applied to the second light blocking layer 510. In other embodiments, the second light blocking layer 510 may be connected to the third gate electrode 170, or may be grounded.

The second inorganic layer 114 may be disposed on the second organic layer 113, the first light blocking layer 530, and the second light blocking layer 510. In other words, the second inorganic layer 114 may be disposed over the whole second organic layer 113. For example, the second inorganic layer 114 may sufficiently cover the first and second light blocking layers 530 and 510 on the second organic layer 113, and may have a substantially flat top surface without creating a step around the first and second light blocking layers 530 and 510. In some embodiments, the second inorganic layer 114 may be disposed along a profile of the first and second light blocking layers 530 and 510 with a uniform thickness to cover the first and second light blocking layers 530 and 510 on the second organic layer 113. The second inorganic layer 114 may block moisture penetrating through the second organic layer 113. The second inorganic layer 114 may include an inorganic material having flexibility. In the embodiments, the second inorganic layer 114 may include the same material as the first inorganic layer 112.

Accordingly, the substrate 110 including the first organic layer 111, the first inorganic layer 112, the second organic layer 113, and the second inorganic layer 114 may be provided.

However, although the substrate 110 has been described as having four layers, the configurations of the inventive concepts are not limited thereto. For example, the substrate 110 may include at least three layers.

The buffer layer 115 may be disposed on the substrate 110. In other words, the buffer layer 115 may be disposed over the whole of the substrate 110 and the driving transistor 260 between the substrate 110 and the driving transistor 260. The buffer layer 115 may prevent metal atoms or impurities from diffusing from the substrate 110 to the driving transistor 260, the first switching transistor 255, and the second switching transistor 250, and may control a heat transfer rate during a crystallization process for forming the first active layer 140 and the third active layer 130 to obtain substantially uniform first and third active layers 140 and 130. In addition, when a surface of the substrate 110 is not uniform, the buffer layer 115 may serve to improve flatness of the surface of the substrate 110. Depending on a type of the substrate 110, at least two buffer layers 115 may be provided on the substrate 110, or the buffer layer 115 may not be provided. The buffer layer 115 may include a silicon compound, metal oxide, and the like. In other embodiments, the buffer layer 115 may be disposed only in the fourth display area 10 without being disposed in the first display area 20, the second display area 40, and the third display area 30. In other words, the buffer layer 115 may not overlap the first functional module 410, the second functional module 430, and the third functional module 420.

The first active layer 140 may be disposed on the buffer layer 115. In other words, the first active layer 140 may be disposed on a portion of the buffer layer 115 under which the first light blocking layer 530 is located. The active layer 130 may include a metal oxide semiconductor, an inorganic semiconductor (e.g., amorphous silicon or polysilicon), an organic semiconductor, or the like. In the embodiments, the first active layer 140 may include polysilicon. The first active layer 140 may include a source region, a drain region, and a channel region located between the source region and the drain region.

The third active layer 130 may be disposed on the buffer layer 115 while being spaced apart from the first active layer 140. In other words, the third active layer 130 may be disposed on a portion of the buffer layer 115 under which the second light blocking layer 510 is located. In the embodiments, the third active layer 130 and the first active layer 140 may be disposed on the same layer, and may include the same material. The third active layer 130 may include a source region, a drain region, and a channel region located between the source region and the drain region.

The first gate insulating layer 150 may be disposed on the buffer layer 115, the first active layer 140, and the third active layer 130. In other words, the first gate insulating layer 150 may be disposed over the whole buffer layer 115. Alternatively, the first gate insulating layer 150 may be disposed only in the fourth display area 10 without being disposed in the first, second, and third display areas 20, 40, and 30. In other words, the first gate insulating layer 150 may not overlap the first, second, and third functional modules 410, 430, and 420.

The first gate insulating layer 150 may sufficiently cover the first and third active layers 140 and 130 on the buffer layer 115, and may have a substantially flat top surface without creating a step around the first and third active layers 140 and 130. In some embodiments, the first gate insulating layer 150 may be disposed along a profile of the first and third active layers 140 and 130 with a uniform thickness to cover the first and third active layers 140 and 130 on the buffer layer 115. The first gate insulating layer 150 may include a silicon compound, metal oxide, and the like. In other embodiments, the first gate insulating layer 150 may have a multilayer structure including a plurality of insulating layers. The insulating layers may include mutually different materials, and may have mutually different thicknesses.

The first gate electrode 180 may be disposed on the first gate insulating layer 150. In other words, the first gate electrode 180 may be disposed on a portion of the first gate insulating layer 150 under which the first active layer 140 is located. The first gate electrode 180 may include a metal, an alloy, metal nitride, conductive metal oxide, a transparent conductive material, and the like. These may be used alone or in combination with each other. In other embodiments, the first gate electrode 180 may have a multilayer structure including a plurality of metal layers. The metal layers may include mutually different materials, and may have mutually different thicknesses.

The third gate electrode 170 may be disposed on the first gate insulating layer 150 while being spaced apart from the first gate electrode 180. In other words, the third gate electrode 170 may be disposed on a portion of the first gate insulating layer 150 under which the third active layer 130 is located. In the embodiments, the third gate electrode 170 may be disposed on the same layer as the first gate electrode 180 and the lower gate electrode 185, and may include the same material as the first gate electrode 180 and the lower gate electrode 185.

The lower gate electrode 185 may be disposed on the first gate insulating layer 150 while being spaced apart from the first gate electrode 180 and the third gate electrode 170. In other words, the lower gate electrode 185 may be disposed under a portion of the first gate insulating layer 150 on which the second active layer 135 is located. In addition, the lower gate electrode 185 may overlap the second gate electrode 175. In the embodiments, the lower gate electrode 185 may be disposed on the same layer as the first gate electrode 180 and the third gate electrode 170, and may include the same material as the first gate electrode 180 and the third gate electrode 170. The lower gate electrode 185 may function as a back gate of the first switching transistor 255, and may function as a light blocking layer configured to block the external light from penetrating into the second active layer 135.

The first interlayer insulating layer 190 may be disposed on the first gate insulating layer 150, the first gate electrode 180, the third gate electrode 170, and the lower gate electrode 185. In other words, the first interlayer insulating layer 190 may be disposed over the whole the first gate insulating layer 150. Alternatively, the first interlayer insulating layer 190 may be disposed only in the fourth display area 10 without being disposed in the first, second, and third display areas 20, 40, and 30. In other words, the first interlayer insulating layer 190 may not overlap the first, second, and third functional modules 410, 430, and 420.

The first interlayer insulating layer 190 may sufficiently cover the first, third, and lower gate electrodes 180, 170, and 185 on the first gate insulating layer 150, and may have a substantially flat top surface without creating a step around the first, third, and lower gate electrodes 180, 170, and 185. In some embodiments, the first interlayer insulating layer 190 may be disposed along a profile of the first, third, and lower gate electrodes 180, 170, and 185 with a uniform thickness to cover the first, third, and lower gate electrodes 180, 170, and 185 on the first gate insulating layer 150. The first interlayer insulating layer 190 may include a silicon compound, metal oxide, and the like. In other embodiments, the first interlayer insulating layer 190 may have a multilayer structure including a plurality of insulating layers. The insulating layers may include mutually different materials, and may have mutually different thicknesses.

The upper capacitor electrode 145 may be disposed on the first interlayer insulating layer 190. In other words, the upper capacitor electrode 145 may be disposed on a portion of the first interlayer insulating layer 190 under which the first gate electrode 180 is located. In the embodiments, the upper capacitor electrode 145 may include an opening 232 that overlaps at least a part of the first gate electrode 180. In addition, the upper capacitor electrode 145 may include a metal oxide semiconductor. In other words, the upper capacitor electrode 145 may be a metal oxide semiconductor layer including a binary compound ($AB_x$), a ternary compound ($AB_xC_y$), a quaternary compound ($AB_xC_yD_z$), and the like that contain indium (In), zinc (Zn), gallium (Ga), tin (Sn), titanium (Ti), aluminum (Al), hafnium (Hf), zirconium (Zr), magnesium (Mg), and the like. For example, the upper capacitor electrode 145 may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (Z TO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and the like.

Accordingly, the capacitor 265 including the upper capacitor electrode 145 and the first gate electrode 180 may be provided. For example, a gate initialization voltage may be applied to the first gate electrode 180, and a high power supply voltage may be applied to the upper capacitor electrode 145.

The second active layer 135 may be disposed on the first interlayer insulating layer 190 while being spaced apart from the upper capacitor electrode 145. In other words, the second active layer 135 may be disposed on a portion of the first interlayer insulating layer 190 under which the lower gate electrode 185 is located. In the embodiments, the second active layer 135 and the upper capacitor electrode 145 may be disposed on the same layer, and may include the same material. The second active layer 135 may include a source region, a drain region, and a channel region located between the source region and the drain region.

The second gate insulating layer 155 may be disposed on the first interlayer insulating layer 190, the upper capacitor electrode 145, and the second active layer 135. In other words, the second gate insulating layer 155 may be disposed over the whole first interlayer insulating layer 190. Alternatively, the second gate insulating layer 155 may be dispose d only in the fourth display area 10 without being disposed in the first, second, and third display areas 20, 40, and 30. In other words, the second gate insulating layer 155 may not overlap the first, second, and third functional modules 410, 430, and 420.

The second gate insulating layer 155 may sufficiently cover the upper capacitor electrode 145 and the second active layer 135 on the first interlayer insulating layer 190, and may have a substantially flat top surface without creating a step around the upper capacitor electrode 145 and the second active layer 135. In some embodiments, the second gate insulating layer 155 may be disposed along a profile of the upper capacitor electrode 145 and the second active layer 135 with a uniform thickness to cover the upper capacitor electrode 145 and the second active layer 135 on the first interlayer insulating layer 190. The second gate insulating layer 155 may include a silicon compound, metal oxide, and the like. In other embodiments, the second gate insulating layer 155 may have a multilayer structure including a plurality of insulating layers. The insulating layers may include mutually different materials, and may have mutually different thicknesses.

The second gate electrode 175 may be disposed on the second gate insulating layer 155. In other words, the second gate electrode 175 may be disposed on a portion of the second gate insulating layer 155 under which the second active layer 135 is located. The second gate electrode 175 may include a metal, an alloy, metal nitride, conductive metal oxide, a transparent conductive material, and the like. These may be used alone or in combination with each other. In other embodiments, the second gate electrode 175 may have a multilayer structure including a plurality of metal layers. The metal layers may include mutually different materials, and may have mutually different thicknesses.

The second interlayer insulating layer 195 may be disposed on the second gate insulating layer 155 and the second gate electrode 175. In other words, the second interlayer insulating layer 195 may be disposed over the whole second gate insulating layer 155. Alternatively, the second interlayer insulating layer 195 may be disposed only in the fourth display area 10 without being disposed in the first, second, and third display areas 20, 40, and 30. In other words, the second interlayer insulating layer 195 may not overlap the first, second, and third functional modules 410, 430, and 420.

The second interlayer insulating layer 195 may sufficiently cover the second gate electrode 175 on the second gate insulating layer 155, and may have a substantially flat top surface without creating a step around the second gate electrode 175. In some embodiments, the second interlayer insulating layer 195 may be disposed along a profile of the second gate electrode 175 with a uniform thickness to cover the second gate electrode 175 on the second gate insulating layer 155. The second interlayer insulating layer 195 may include a silicon compound, metal oxide, and the like. In other embodiments, the second interlayer insulating layer 195 may have a multilayer structure including a plurality of insulating layers. The insulating layers may include mutually different materials, and may have mutually different thicknesses.

In another sectional view of the display device 100, the first source electrode and the first drain electrode may be disposed on the second interlayer insulating layer 195. The first source electrode may be connected to the source region of the first active layer 140 through a first contact hole formed by removing first portions of the first gate insulating layer 150, the first interlayer insulating layer 190, the second gate insulating layer 155, and the second interlayer insulating layer 195, and the first drain electrode may be connected to the drain region of the first active layer 140 through a second contact hole formed by removing second portions of the first gate insulating layer 150, the first interlayer insulating layer 190, the second gate insulating layer 155, and the second interlayer insulating layer 195.

Accordingly, the driving transistor 260 including the first active layer 140, the first gate electrode 180, the first source electrode, and the first drain electrode may be provided.

The second source electrode 215 and the second drain electrode 235 may be disposed on the second interlayer insulating layer 195 while being spaced apart from the first source electrode and the first drain electrode. The second source electrode 215 may be connected to the source region of the second active layer 135 through a third contact hole for med by removing first portions of the second gate insulating layer 155 and the second interlayer insulating layer 195, and the second drain electrode 235 may be connected to the drain region of the second active layer 135 through a fourth contact hole formed by removing second portions of the second gate insulating layer 155 and the second interlayer insulating layer 195.

Accordingly, the first switching transistor 255 including the second active layer 135, the second gate electrode 175, the second source electrode 215, and the second drain electrode 235 may be provided.

The third source electrode 210 and the third drain electrode 230 may be disposed on the second interlayer insulating layer 195 while being spaced apart from the first source electrode, the first drain electrode, the second source electrode 215, and the second drain electrodes 235. The third source electrode 210 may be connected to the source region of the third active layer 130 through a fifth contact hole formed by removing third portions of the first gate insulating layer 150, the first interlayer insulating layer 190, the second gate insulating layer 155, and the second interlayer insulating layer 195, and the third drain electrode 230 may be connected to the drain region of the third active layer 130 through a sixth contact hole formed by removing fourth portions of the first gate insulating layer 150, the first interlayer insulating layer 190, the second gate insulating layer 155, and the second interlayer insulating layer 195.

Accordingly, the second switching transistor 250 including the third active layer 130, the third gate electrode 170, the third source electrode 210, and the third drain electrode 230 may be provided.

Each of the first source electrode, the first drain electrode, the second source electrode 215, the second drain electrode 235, the third source electrode 210, and the third drain electrode 230 may include a metal, an alloy, metal nitride, conductive metal oxide, a transparent conductive material, and the like. These may be used alone or in combination with each other. In other embodiments, each of the first source electrode, the first drain electrode, the second source electrode 215, the second drain electrode 235, the third source electrode 210, and the third drain electrode 230 may have a multilayer structure including a plurality of metal layers. The metal layers may include mutually different materials, and may have mutually different thicknesses.

However, although the display device 100 has been described as including three transistors and one capacitor, the configurations of the inventive concepts are not limited thereto. For example, the display device 100 may include at least four transistors and at least one capacitor.

The first power supply electrode 245 may be disposed on the second interlayer insulating layer 195. The first power supply electrode 245 may be connected to the first gate electrode 180 through a seventh contact hole formed by removing portions of the first interlayer insulating layer 190, the second gate insulating layer 155, and the second interlayer insulating layer 195. In this case, the seventh contact hole may pass through the opening 232 of the upper capacitor electrode 145. The gate initialization voltage may be applied to the first power supply electrode 245, and the gate initialization voltage may be applied to the first gate electrode 180 through the seventh contact hole.

The second power supply electrode 240 may be disposed on the second interlayer insulating layer 195 while being spaced apart from the first power supply electrode 245. The second power supply electrode 240 may be connected to the upper capacitor electrode 145 through an eighth contact hole formed by removing third portions of the second interlayer insulating layer 195 and the second gate insulating layer 155. The high power supply voltage may be applied to the second power supply electrode 240, and the high power supply voltage may be applied to the upper capacitor electrode 145 through the eighth contact hole.

In the embodiments, the first power supply electrode 245 and the second power supply electrode 240 may be disposed on the same layer as the first source electrode, the first drain electrode, the second source electrode 215, the second drain electrode 235, the third source electrode 210, and the third drain electrode 230, and may include the same material as the first source electrode, the first drain electrode, the second source electrode 215, the second drain electrode 235, the third source electrode 210, and the third drain electrode 230.

The first planarization layer 270 may be disposed on the second interlayer insulating layer 195, the first and second power supply electrodes 245 and 240, the first source electrode, the first drain electrode, the second source electrode 215, the second drain electrode 235, the third source electrode 210, and the third drain electrode 230. The first planarization layer 270 may have a relatively thick thickness, and may have a substantially flat top surface. The first planarization layer 270 may be formed of an organic insulating material or an inorganic insulating material. In the embodiments, the first planarization layer 270 may include an organic insulating material. For example, the first planarization layer 270 may include a photoresist, a polyacryl-based resin, a polyimide-based resin, a polyamide-based resin, a siloxane-based resin, an acryl-based resin, an epoxy-based resin, and the like.

The power supply wire 285 may be disposed on the first planarization layer 270. The power supply wire 285 may be connected to the second power supply electrode 240 through a ninth contact hole formed by removing a first portion of the first planarization layer 270. The high power supply voltage may be provided to the power supply wire 285, and the high power supply voltage may be provided to the second power supply electrode 240 through the ninth contact hole. The power supply wire 285 may include a metal, an alloy, metal nitride, conductive metal oxide, a transparent conductive material, and the like. These may be used alone or in combination with each other. In other embodiments, the power supply wire 285 may have a multilayer structure including a plurality of metal layers. The metal layers may include mutually different materials, and may have mutually different thicknesses.

The connection electrode 280 may be disposed on the first planarization layer 270 while being spaced apart from the power supply wire 285. The connection electrode 280 may be connected to the third drain electrode 230 through a tenth contact hole formed by removing a second portion of the first planarization layer 270. In other words, the connection electrode 280 may electrically connect the lower electrode 290 to the third drain electrode 230. In the embodiments, the connection electrode 280 and the power supply wire 285 may be disposed on the same layer, and may include the same material.

The second planarization layer 275 may be disposed on the first planarization layer 270, the power supply wire 285, and the connection electrode 280. The second planarization layer 275 may have a relatively thick thickness, and may have a substantially flat top surface. The second planarization layer 275 may be formed of an organic insulating material or an inorganic insulating material. In the embodiments, the second planarization layer 275 may include an organic insulating material.

The lower electrode 290 may be disposed on the second planarization layer 275. The lower electrode 290 may be connected to the connection electrode 280 through a contact hole formed by removing a portion of the second planarization layer 275, and the lower electrode 290 may be electrically connected to the second switching transistor 250. The lower electrode 290 may include a metal, an alloy, metal nitride, conductive metal oxide, a transparent conductive material, and the like. These may be used alone or in combination with each other. In other embodiments, the lower electrode 290 may have a multilayer structure including a plurality of metal layers. The metal layers may include mutually different materials, and may have mutually different thicknesses. In other embodiments, the contact hole of the second planarization layer 275 may be located under the pixel defining layer 310. In this case, the contact hole may not be visually recognized by the user of the display device 100, and display quality of the display device 100 may be relatively improved.

The pixel defining layer 310 may be disposed on the second planarization layer 275 and a part of the lower electrode 290. In other words, the pixel defining layer 310 may expose a part of the lower electrode 290. The pixel defining layer 310 may be formed of an organic insulating material or an inorganic insulating material. In the embodiments, the pixel defining layer 310 may include an organic insulating material.

The light emitting layer 330 may be disposed on the lower electrode 290. The light emitting layer 330 may have a multilayer structure including an organic light emission layer EML, a hole injection layer HIL, a hole transport layer HTL, an electron transport layer ETL, an electron injection layer EIL, and the like. The organic light emission layer EML of the light emitting layer 330 may be formed by using at least one of light emitting materials for emitting different color lights (i.e., a red light, a green light, a blue light, etc.) according to sub-pixels. Alternatively, the organic light emission layer EML of the light emitting layer 330 may be formed by stacking a plurality of light emitting materials for generating different color lights such as a red light, a green light, and a blue light to emit a white light as a whole. In this case, a color filter may be disposed on the light emitting layer 330 disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330. The upper electrode 340 may include a metal, an alloy, metal nitride, conductive metal oxide, a transparent conductive material, and the like. These may be used alone or in combination with each other. In other embodiments, the upper electrode 340 may have a multilayer structure including a plurality of metal layers. For example, the metal layers may include mutually different materials, and may have mutually different thicknesses.

Accordingly, the light emitting structure 200 including the lower electrode 290, the light emitting layer 330, and the upper electrode 340 may be provided.

The first inorganic thin film encapsulation layer 451 may be disposed on the upper electrode 340. For example, the first inorganic thin film encapsulation layer 451 may be disposed along a profile of the upper electrode 340. The first inorganic thin film encapsulation layer 451 may prevent the light emitting structure 200 from deteriorating due to penetration of moisture, oxygen, and the like. In addition, the first inorganic thin film encapsulation layer 451 may perform a function of protecting the light emitting structure 200 from an external impact.

The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display device 100, and may protect the light emitting structure 200 together with the first inorganic thin film encapsulation layer 451. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may disposed along a profile of the organic thin film encapsulation layer 452 with a uniform thickness to cover the organic thin film encapsulation layer 452. The second inorganic thin film encapsulation layer 453 may prevent the light emitting structure 200 from deteriorating due to the penetration of moisture, oxygen, and the like together with the first inorganic thin film encapsulation layer 451. In addition, the second inorganic thin film encapsulation layer 453 may perform a function of protecting the light emitting structure 200 from an external impact together with the first inorganic thin film encapsulation layer 451 and the organic thin film encapsulation layer 452. The second inorganic thin film encapsulation layer 453 may include an inorganic insulating material having flexibility.

Accordingly, the thin film encapsulation structure 450 including the first inorganic thin film encapsulation layer 451, the organic thin film encapsulation layer 452, and the second inorganic thin film encapsulation layer 453 may be provided. In some embodiments, the thin film encapsulation structure 450 may have a five-layer structure in which first to fifth thin film encapsulation layers are stacked or a seven-layer structure in which first to seventh thin film encapsulation layers are stacked.

The lower structure 400 may be disposed on the bottom surface of the substrate 110. The lower structure 400 may include an impact absorption layer disposed on the bottom surface of the substrate 110, a heat dissipation plate disposed under the impact absorption layer, an adhesive layer disposed between the impact absorption layer and the heat dissipation plate, and the like. The lower structure 400 may include a first opening 400*a*, a second opening 400*b*, and a third opening 400*c*.

The first functional module 410 may be disposed in the first opening 400*a* of the lower structure 400. The first functional module 410 may be a proximity sensor module or an infrared sensor module.

The second functional module 430 may be disposed in the second opening 400*b* of the lower structure 400. The second functional module 430 may be a fingerprint recognition sensor module.

The third functional module 420 may be disposed in the third opening 400*c* of the lower structure 400. The third functional module 420 may be a camera module.

As described above, the display device 100 including the first functional module 410, the second functional module 430, the third functional module 420, the lower structure 400, the substrate 110, the silicon layer 120, the first light blocking layer 530, the second light blocking layer 510, the buffer layer 115, the driving transistor 260, the capacitor 265, the first switching transistor 255, the second switching transistor 250, the lower gate electrode 185, the first gate insulating layer 150, the first interlayer insulating layer 190, the second gate insulating layer 155, the second interlayer insulating layer 195, the first power supply electrode 245, the second power supply electrode 240, the power supply wire 285, the connection electrode 280, the first planarization layer 270, the second planarization layer 275, the light emitting structure 200, the pixel defining layer 310, the thin film encapsulation layer 450, and the like may be provided.

For example, according to a conventional display device, an upper capacitor electrode may include a metal, and the conventional display device may be provided by performing a total of 14 mask processes to include a light blocking layer.

Since the display device 100 according to the embodiments of the inventive concepts includes the capacitor 265 including the upper capacitor electrode 145 including a metal oxide semiconductor and the first gate electrode 180, the display device 100 including the first light blocking layer 530 and the second light blocking layer 510 may be provided through a total of 13 mask processes without adding a mask process. Accordingly, the display device 100 may include the first light blocking layer 530 and the second light blocking layer 510, so that the driving transistor 260 may not be influenced by the polarization, and a failure of the driving transistor 260 may be prevented. In addition, since the mask process is not added, a manufacturing cost of the display device 100 may be relatively reduced.

FIGS. 6 to 16 are cross-sectional views showing a method of manufacturing a display device according to embodiments of the inventive concepts.

Figure 6:
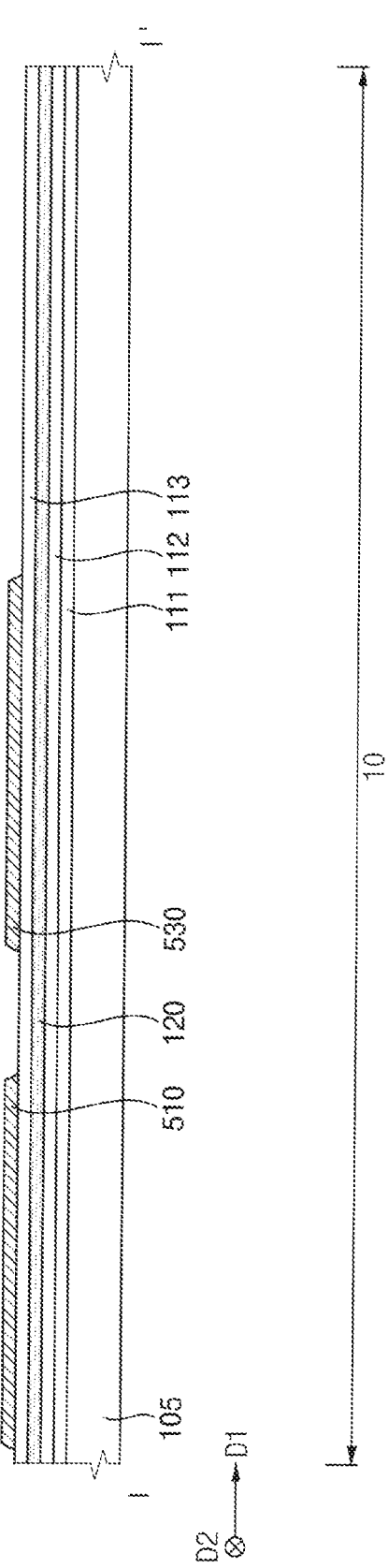

Referring to FIG. 6, a rigid glass substrate 105 may be provided. The first organic layer 111 may be formed on the glass substrate 105. The first organic layer 111 may be formed by using an organic material having flexibility. In embodiments, the first organic layer 111 may include polyimide.

The first inorganic layer 112 may be formed on the first organic layer 111. The first inorganic layer 112 may block the moisture penetrating through the first organic layer 111.

The first inorganic layer 112 may be formed by using an inorganic material having flexibility. In the embodiments, the first inorganic layer 112 may include a silicon compound, metal oxide, or the like. For example, the first inorganic layer 112 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

The silicon layer 120 may be formed on the first inorganic layer 112. The silicon layer 120 may include a silicon material having an adhesive function. In the embodiments, the silicon layer 120 may be formed by using amorphous silicon.

The second organic layer 113 may be formed on the silicon layer 120. The second organic layer 113 may be formed by using an organic material having flexibility. For example, the second organic layer 113 may include polyimide.

The first light blocking layer 530 may be formed on the second organic layer 113. The first light blocking layer 530 may be formed by using a metal, an alloy, metal nitride, conductive metal oxide, a transparent conductive material, and the like. For example, the first light blocking layer 530 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. These may be used alone or in combination with each other.

The second light blocking layer 510 may be formed on the second organic layer 113 while being spaced apart from the first light blocking layer 530. In the embodiments, the second light blocking layer 510 and the first light blocking layer 530 may be simultaneously formed on the same layer by using the same material. For example, after a first preliminary metal layer is formed over the whole second organic layer 113, the first preliminary metal layer may be partially etched through a first mask process, and the first light blocking layer 530 and the second light blocking layer 510 may be simultaneously formed on the second organic layer 113.

Figure 7:
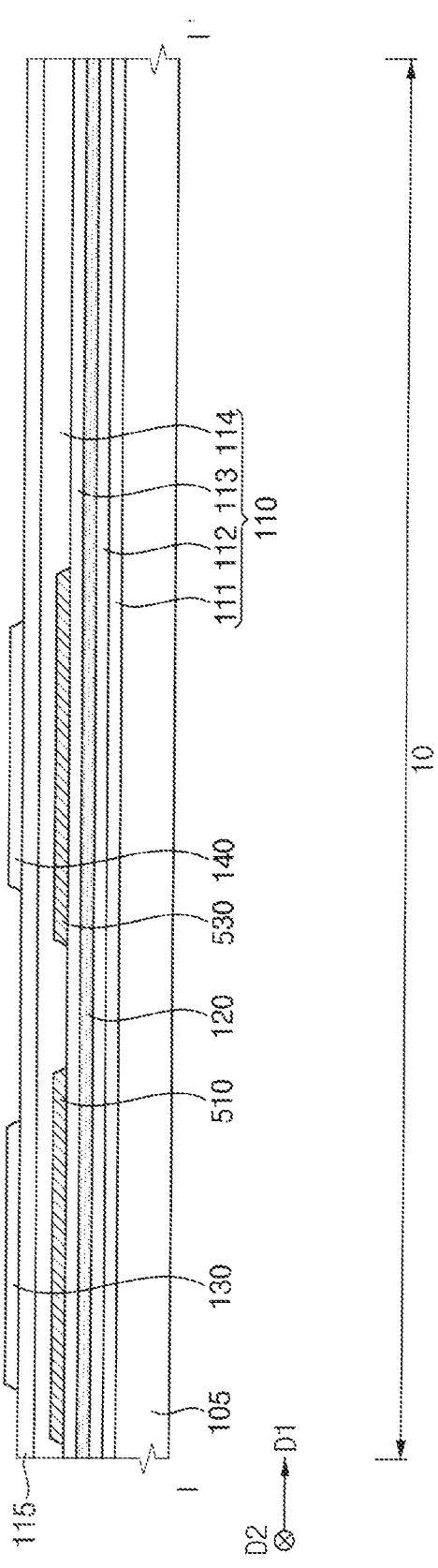

Referring to FIG. 7, the second inorganic layer 114 may be formed on the second organic layer 113, the first light blocking layer 530, and the second light blocking layer 510. For example, the second inorganic layer 114 may sufficiently cover the first and second light blocking layers 530 and 510 on the second organic layer 113, and may have a substantially flat top surface without creating a step around the first and second light blocking layers 530 and 510. In some embodiments, the second inorganic layer 114 may be formed along the profile of the first and second light blocking layers 530 and 510 with a uniform thickness to cover the first and second light blocking layers 530 and 510 on the second organic layer 113. The second inorganic layer 114 may block the moisture penetrating through the second organic layer 113. The second inorganic layer 114 may be formed by using an inorganic material having flexibility. In the embodiments, the second inorganic layer 114 may include the same material as the first inorganic layer 112.

Accordingly, the substrate 110 including the first organic layer 111, the first inorganic layer 112, the second organic layer 113, and the second inorganic layer 114 may be formed.

Since the substrate 110 is thin and flexible, the substrate 110 may be formed on the rigid glass substrate 105. For example, after performing a subsequent process, the glass substrate may be removed from the substrate 110. In other words, due to flexible physical properties of the substrate 110, it may be difficult to directly perform the subsequent process on the substrate 110. When taking the above point into consideration, the subsequent process may be performed by using the rigid glass substrate 105, and the glass substrate 105 may be removed, so that the first organic layer 111, the first inorganic layer 112, the second organic layer 113, and the second inorganic layer 114 may be used as the substrate 110. In addition, the silicon layer 120 may be interposed between the first inorganic layer 112 and the second organic layer 113 so that the first organic layer 111, the first inorganic layer 112, the second organic layer 113, and the second inorganic layer 114 are not separated from each other when the glass substrate 105 is peeled off from the substrate 110.

The buffer layer 115 may be formed on the substrate 110. Depending on the type of the substrate 110, at least two buffer layers 115 may be provided on the substrate 110, or the buffer layer 115 may not be provided. The buffer layer 115 may be formed by using a silicon compound, metal oxide, and the like.

The first active layer 140 may be formed on the buffer layer 115. In other words, the first active layer 140 may be formed on a portion of the buffer layer 115 under which the first light blocking layer 530 is located. The active layer 130 may include a metal oxide semiconductor, an inorganic semiconductor, an organic semiconductor, or the like. In the embodiments, the first active layer 140 may be formed by using polysilicon. The first active layer 140 may include a source region, a drain region, and a channel region located between the source region and the drain region.

The third active layer 130 may be formed on the buffer layer 115 while being spaced apart from the first active layer 140. In other words, the third active layer 130 may be formed on a portion of the buffer layer 115 under which the second light blocking layer 510 is located. The third active layer 130 may include a source region, a drain region, and a channel region located between the source region and the drain region. In the embodiments, the third active layer 130 and the first active layer 140 may be simultaneously formed on the same layer by using the same material. For example, after a polysilicon layer is formed over the whole buffer layer 115, the polysilicon layer may be partially etched through a second mask process, and the first active layer 140 and the third active layer 130 may be simultaneously formed on the buffer layer 115.

Figure 8:
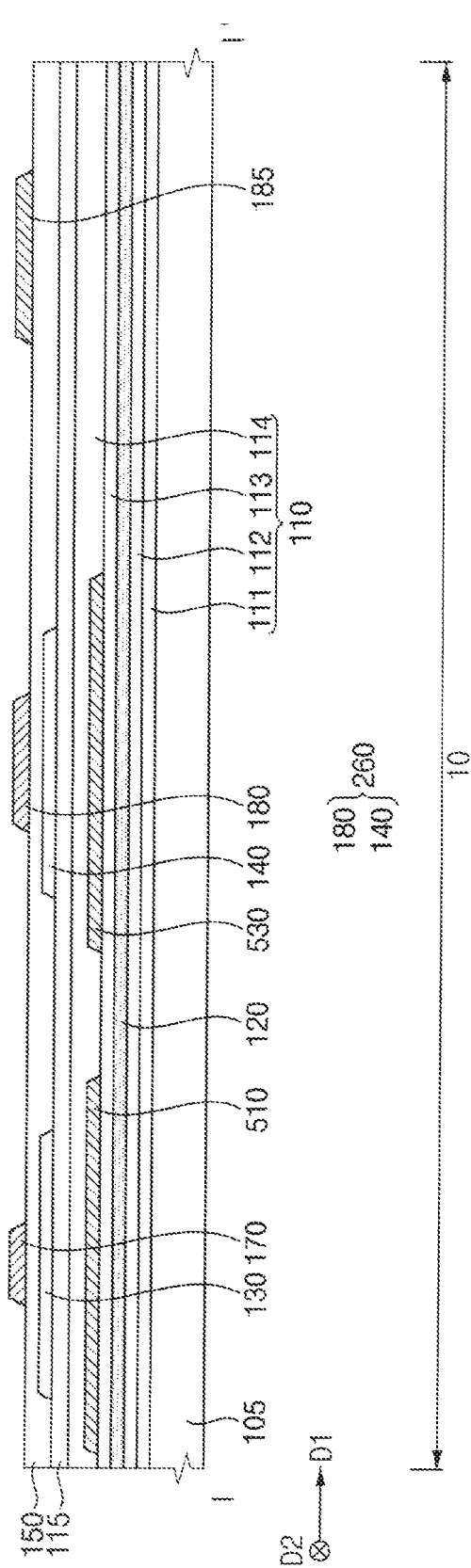

Referring to FIG. 8, the first gate insulating layer 150 may be formed on the buffer layer 115, the first active layer 140, and the third active layer 130. The first gate insulating layer 150 may sufficiently cover the first and third active layers 140 and 130 on the buffer layer 115, and may have a substantially flat top surface without creating a step around the first and third active layers 140 and 130. In some embodiments, the first gate insulating layer 150 may be formed along the profile of the first and third active layers 140 and 130 with a uniform thickness to cover the first and third active layers 140 and 130 on the buffer layer 115. The first gate insulating layer 150 may be formed by using a silicon compound, metal oxide, and the like.

The first gate electrode 180 may be formed on the first gate insulating layer 150. In other words, the first gate electrode 180 may be formed on a portion of the first gate insulating layer 150 under which the first active layer 140 is located. The first gate electrode 180 may be formed by using a metal, an alloy, metal nitride, conductive metal oxide, a transparent conductive material, and the like. These may be used alone or in combination with each other.

The third gate electrode 170 may be formed on the first gate insulating layer 150 while being spaced apart from the first gate electrode 180. In other words, the third gate electrode 170 may be formed on a portion of the first gate insulating layer 150 under which the third active layer 130 is located.

The lower gate electrode 185 may be formed on the first gate insulating layer 150 while being spaced apart from the first gate electrode 180 and the third gate electrode 170. In the embodiments, the lower gate electrode 185 may be formed simultaneously with the first gate electrode 180 and the third gate electrode 170 on the same layer as the first gate electrode 180 and the third gate electrode 170 by using the same material as the first gate electrode 180 and the third gate electrode 170. For example, after a second preliminary metal layer is formed over the whole first gate insulating layer 150, the second preliminary metal layer may be partially etched through a third mask process, and the first gate electrode 180, the third gate electrode 170, and the lower gate electrode 185 may be simultaneously formed on the first gate insulating layer 150.

Accordingly, the driving transistor 260 including the first active layer 140 and the first gate electrode 180 may be formed.

Figure 9:
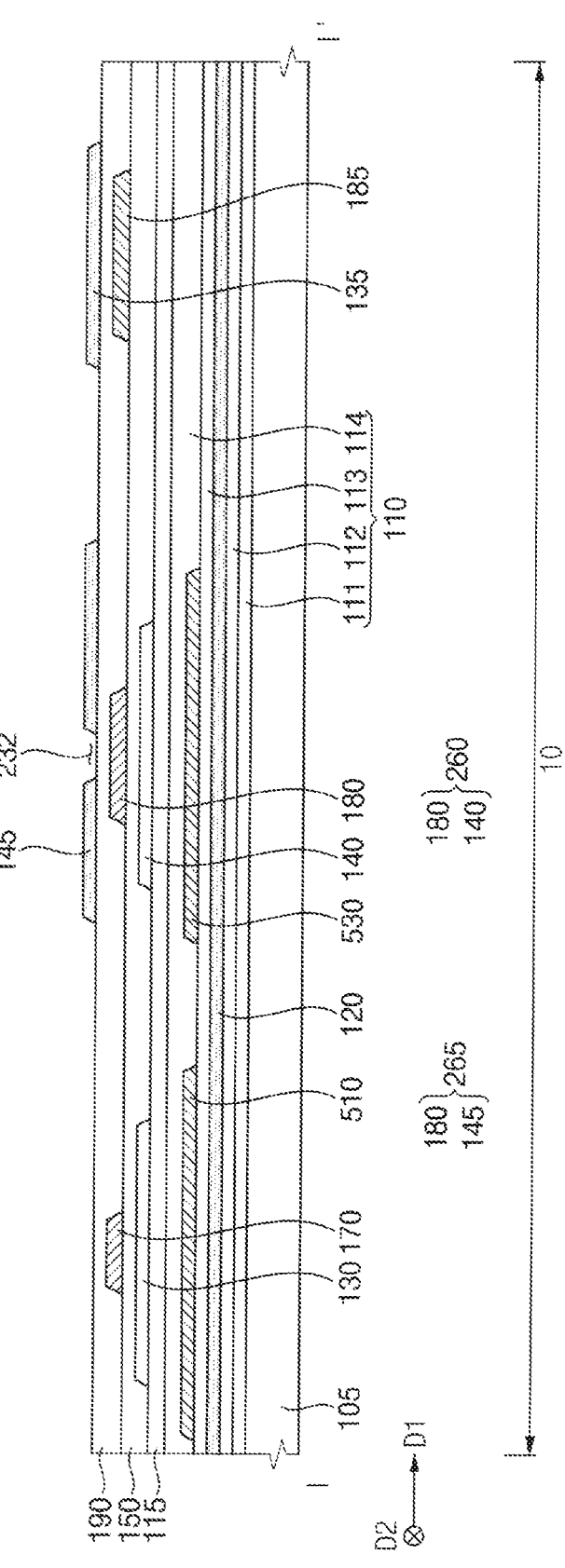

Referring to FIG. 9, the first interlayer insulating layer 190 may be formed on the first gate insulating layer 150, the first gate electrode 180, the third gate electrode 170, and the lower gate electrode 185. The first interlayer insulating layer 190 may sufficiently cover the first, third, and lower gate electrodes 180, 170, and 185 on the first gate insulating layer 150, and may have a substantially flat top surface without creating a step around the first, third, and lower gate electrodes 180, 170, and 185. In some embodiments, the first interlayer insulating layer 190 may be formed along the profile of the first, third, and lower gate electrodes 180, 170, and 185 with a uniform thickness to cover the first, third, and lower gate electrodes 180, 170, and 185 on the first gate insulating layer 150. The first interlayer insulating layer 190 may be formed by using a silicon compound, metal oxide, and the like.

The upper capacitor electrode 145 may be formed on the first interlayer insulating layer 190. In other words, the upper capacitor electrode 145 may be formed on a portion of the first interlayer insulating layer 190 under which the first gate electrode 180 is located. In the embodiments, the upper capacitor electrode 145 may include the opening 232 that overlaps at least a part of the first gate electrode 180. In addition, the upper capacitor electrode 145 may be formed by using a metal oxide semiconductor. In other words, the upper capacitor electrode 145 may be a metal oxide semiconductor layer including a binary compound, a ternary compound, a quaternary compound, and the like that contains In, Zn, Ga, Sn, Ti, Al, Hf, Zr, Mg, and the like. For example, the upper capacitor electrode 145 may include $ZnO_x$, $GaO_x$, $TiO_x$, $SnO_x$, $InO_x$, IGO, IZO, ITO, GZO, ZMO, ZTO, $ZnZr_xO_y$, IGZO, IZTO, IGHO, TAZO, IGTO, and the like.

Accordingly, the capacitor 265 including the upper capacitor electrode 145 and the first gate electrode 180 may be formed.

The second active layer 135 may be formed on the first interlayer insulating layer 190 while being spaced apart from the upper capacitor electrode 145. In other words, the second active layer 135 may be formed on a portion of the first interlayer insulating layer 190 under which the lower gate electrode 185 is located. The second active layer 135 may include a source region, a drain region, and a channel region located between the source region and the drain region. In the embodiments, the second active layer 135 and the upper capacitor electrode 145 may be simultaneously formed on the same layer by using the same material. For example, after a preliminary metal oxide semiconductor layer is formed over the whole first interlayer insulating layer 190, the preliminary metal oxide semiconductor layer may be partially etched through a fourth mask process, and the upper capacitor electrode 145 and the second active layer 135 may be simultaneously formed on the first interlayer insulating layer 190.

Figure 10:
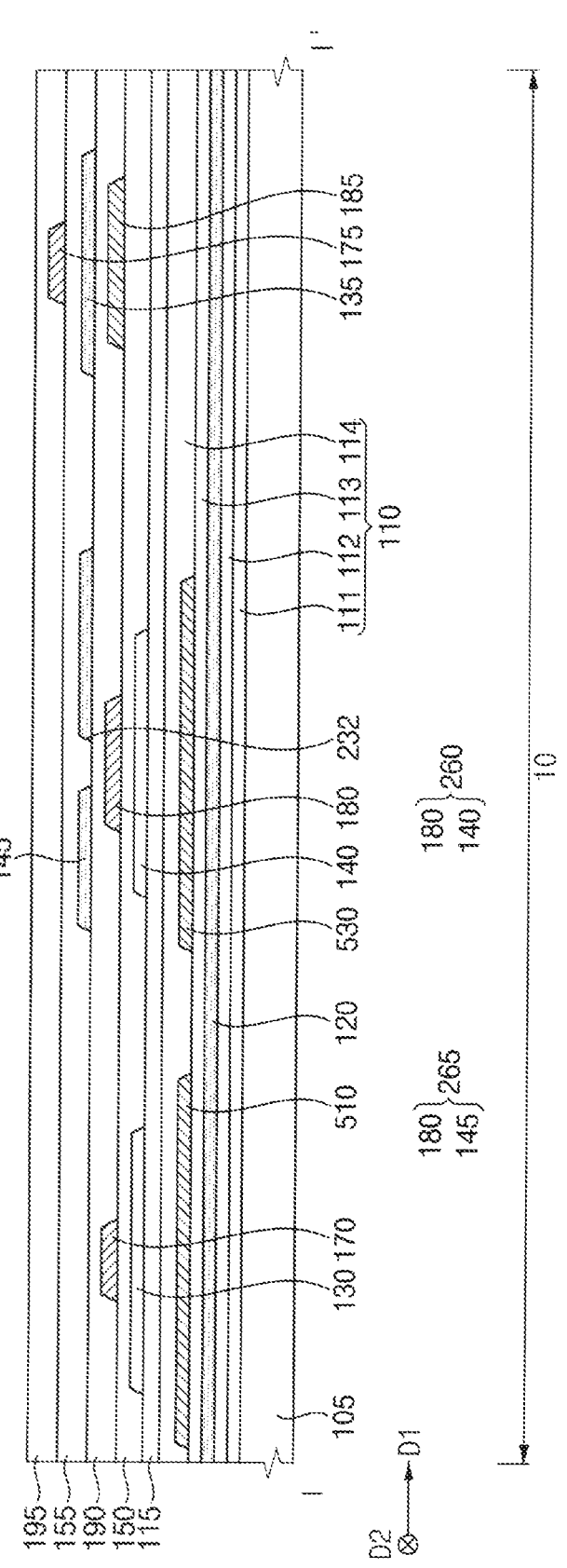

Referring to FIG. 10, the second gate insulating layer 155 may be formed on the first interlayer insulating layer 190, the upper capacitor electrode 145, and the second active layer 135. The second gate insulating layer 155 may sufficiently cover the upper capacitor electrode 145 and the second active layer 135 on the first interlayer insulating layer 190, and may have a substantially flat top surface without creating a step around the upper capacitor electrode 145 and the second active layer 135. In some embodiments, the second gate insulating layer 155 may be formed along the profile of the upper capacitor electrode 145 and the second active layer 135 with a uniform thickness to cover the upper capacitor electrode 145 and the second active layer 135 on the first interlayer insulating layer 190. The second gate insulating layer 155 may be formed by using a silicon compound, metal oxide, and the like.

The second gate electrode 175 may be formed on the second gate insulating layer 155. In other words, the second gate electrode 175 may be formed on a portion of the second gate insulating layer 155 under which the second active layer 135 is located. The second gate electrode 175 may be formed by using a metal, an alloy, metal nitride, conductive metal oxide, a transparent conductive material, and the like. These may be used alone or in combination with each other. For example, after a third preliminary metal layer is formed over the whole second gate insulating layer 155, the third preliminary metal layer may be partially etched through a fifth mask process, and the second gate electrode 175 may be formed on the second gate insulating layer 155.

The second interlayer insulating layer 195 may be formed on the second gate insulating layer 155 and the second gate electrode 175. The second interlayer insulating layer 195 may sufficiently cover the second gate electrode 175 on the second gate insulating layer 155, and may have a substantially flat top surface without creating a step around the second gate electrode 175. In some embodiments, the second interlayer insulating layer 195 may be formed along the profile of the second gate electrode 175 with a uniform thickness to cover the second gate electrode 175 on the second gate insulating layer 155. The second interlayer insulating layer 195 may be formed by using a silicon compound, metal oxide, and the like.

Figure 11:
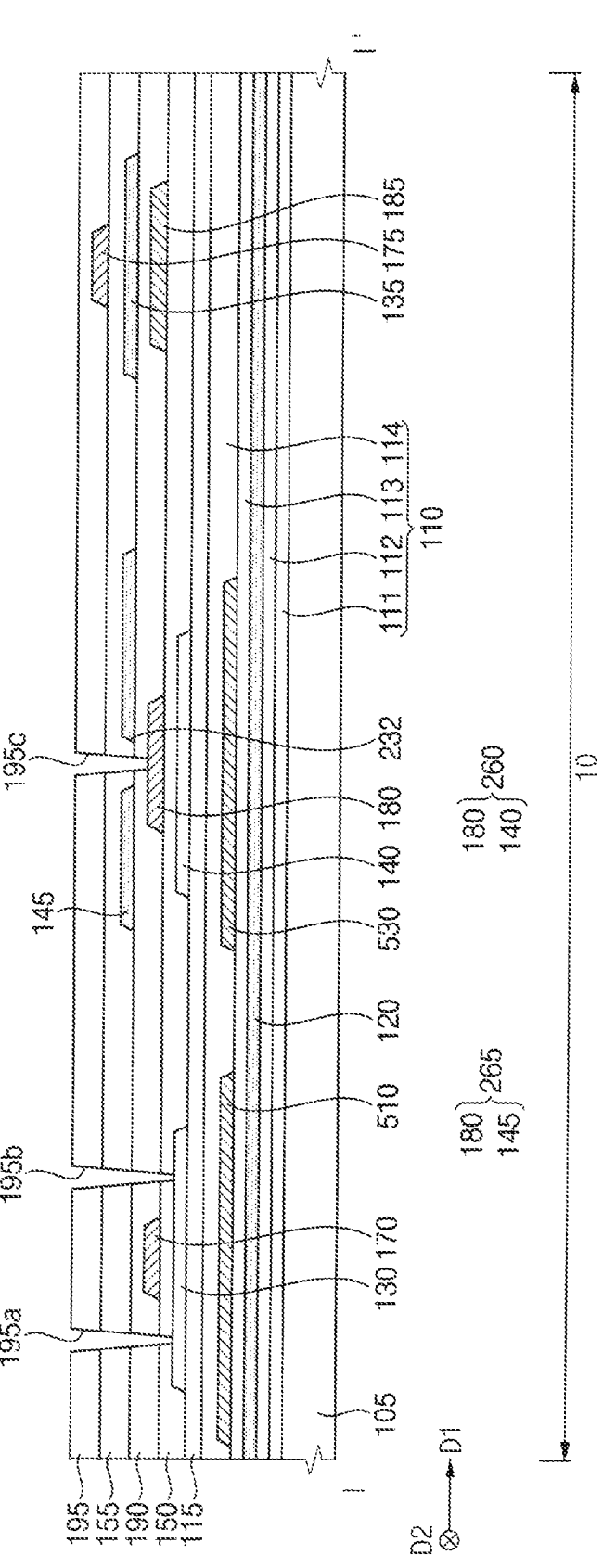

Referring to FIG. 11, a first contact hole 195a that exposes the source region of the third active layer 130 may be formed by removing first portions of the first gate insulating layer 150, the first interlayer insulating layer 190, the second gate insulating layer 155, and the second interlayer insulating layer 195, and a second contact hole 195b that exposes the drain region of the third active layer 130 may be formed by removing second portions of the first gate insulating layer 150, the first interlayer insulating layer 190, the second gate insulating layer 155, and the second interlayer insulating layer 195. Simultaneously with a process of forming the first contact hole 195a and the second contact hole 195b, a third contact hole 195c that exposes a part of a top surface of the first gate electrode 180 may be formed by removing portions of the second interlayer insulating layer 195, the second gate insulating layer 155, and the first interlayer insulating layer 190. The third contact hole 195c may pass through the opening 232 of the upper capacitor electrode 145. In the embodiments, the first contact hole 195a, the second contact hole 195b, and the third contact hole 195c may be simultaneously formed through a sixth mask process.

Figure 12:
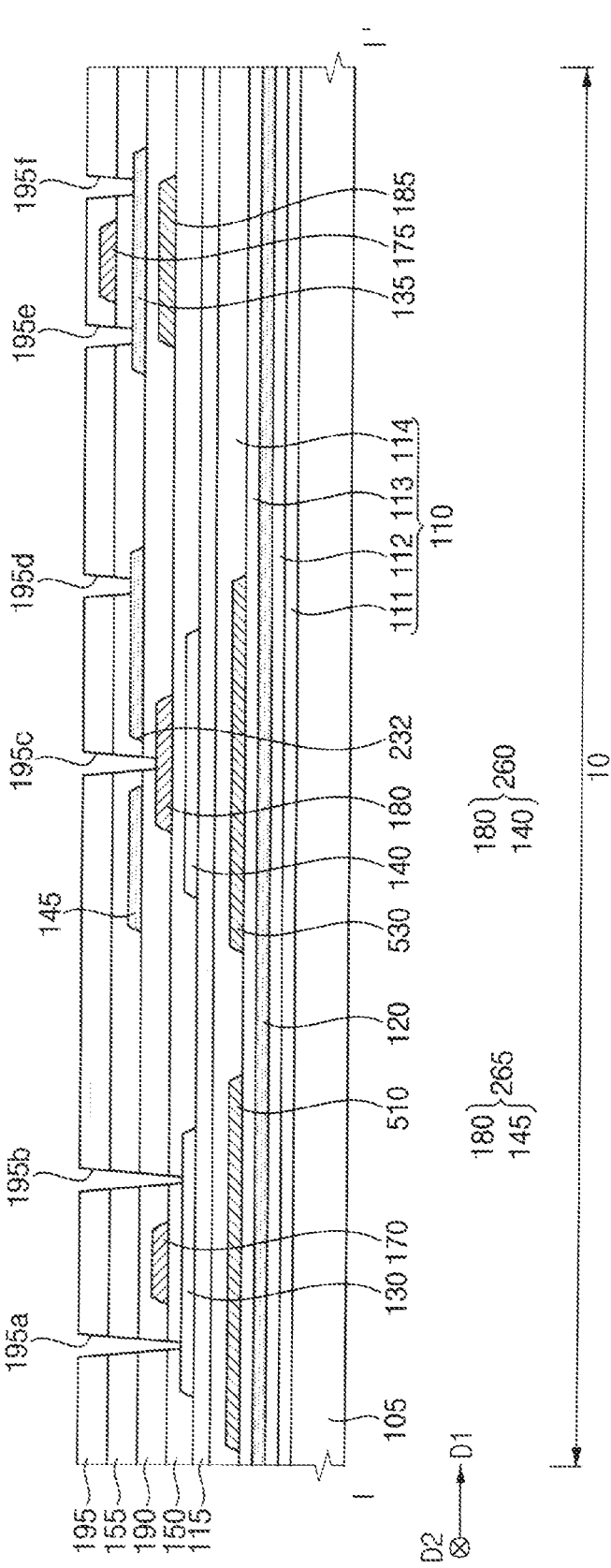

Referring to FIG. 12, a fourth contact hole 195d that exposes a part of the upper capacitor electrode 145 may be formed by removing first portions of the second gate insulating layer 155 and the second interlayer insulating layer 195, a fifth contact hole 195e that exposes the source region of the second active layer 135 may be formed by removing second portions of the second gate insulating layer 155 and the second interlayer insulating layer 195, and a sixth contact hole 195e that exposes the drain region of the second active layer 135 may be formed by removing third portions of the second gate insulating layer 155 and the second interlayer insulating layer 195. In the embodiments, the fourth contact hole 195d, the fifth contact hole 195e, and the sixth contact hole 195e may be simultaneously formed through a seventh mask process.

Figure 13:
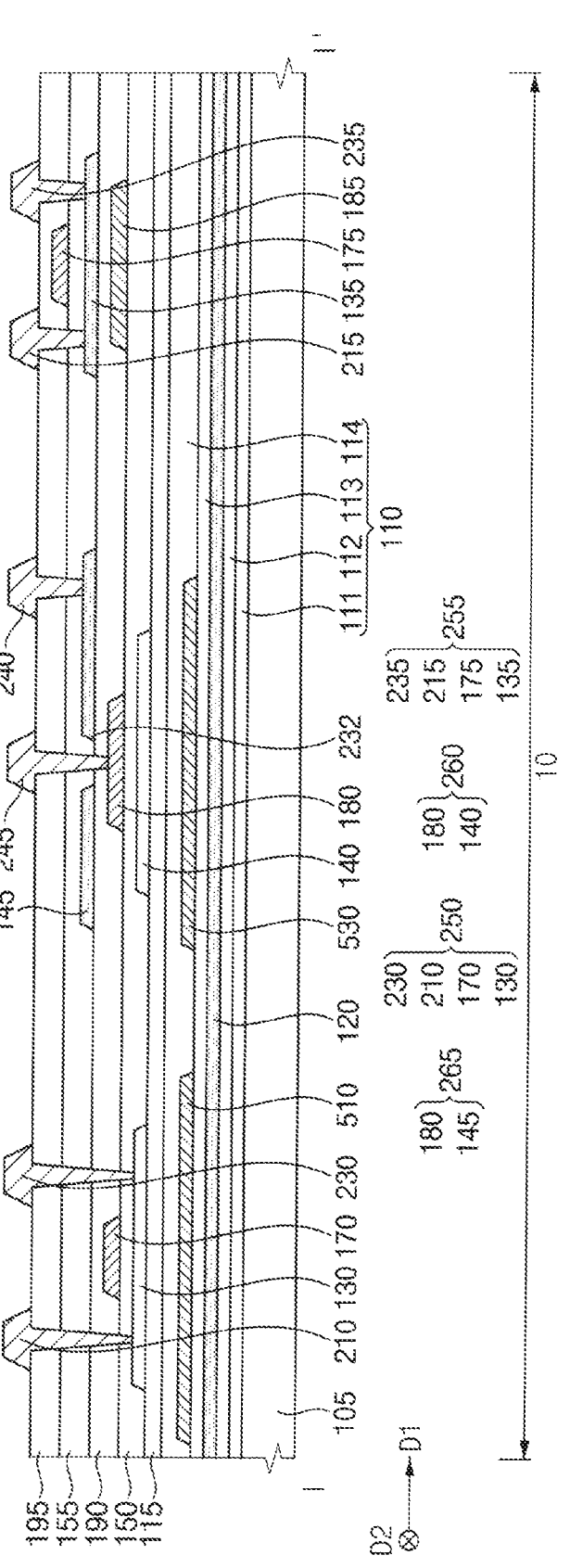

Referring to FIG. 13, the second source electrode 215 and the second drain electrode 235 may be formed on the second interlayer insulating layer 195. The second source electrode 215 may be connected to the source region of the second active layer 135 through the fifth contact hole 195e, and the second drain electrode 235 may be connected to the drain region of the second active layer 135 through the sixth contact hole 195e.

Accordingly, the first switching transistor 255 including the second active layer 135, the second gate electrode 175, the second source electrode 215, and the second drain electrode 235 may be formed.

The third source electrode 210 and the third drain electrode 230 may be formed on the second interlayer insulating layer 195. The third source electrode 210 may be connected to the source region of the third active layer 130 through the first contact hole 195a, and the third drain electrode 230 may be connected to the drain region of the third active layer 130 through the second contact hole 195b.

Accordingly, the second switching transistor 250 including the third active layer 130, the third gate electrode 170, the third source electrode 210, and the third drain electrode 230 may be formed.

Each of the second source electrode 215, the second drain electrode 235, the third source electrode 210, and the third drain electrode 230 may be formed by using a metal, an alloy, metal nitride, conductive metal oxide, a transparent conductive material, and the like. These may be used alone or in combination with each other.

The first power supply electrode 245 may be formed on the second interlayer insulating layer 195. The first power supply electrode 245 may be connected to the first gate electrode 180 through the third contact hole 195c.

The second power supply electrode 240 may be formed on the second interlayer insulating layer 195 while being spaced apart from the first power supply electrode 245. The second power supply electrode 240 may be connected to the upper capacitor electrode 145 through the fourth contact hole 195d. In the embodiments, the first power supply electrode 245 and the second power supply electrode 240 may be formed simultaneously with the second source electrode 215, the second drain electrode 235, the third source electrode 210, and the third drain electrode 230 on the same layer as the second source electrode 215, the second drain electrode 235, the third source electrode 210, and the third drain electrode 230 by using the same material as the second source electrode 215, the second drain electrode 235, the third source electrode 210, and the third drain electrode 230. For example, after a fourth preliminary metal layer is formed over the whole second interlayer insulating layer 195, the fourth preliminary metal layer may be partially etched through an eighth mask process, and the first power supply electrode 245, the second power supply electrode 240, the second source electrode 215, the second drain electrode 235, the third source electrode 210, and the third drain electrode 230 may be simultaneously formed on the second interlayer insulating layer 195.

Figure 14:
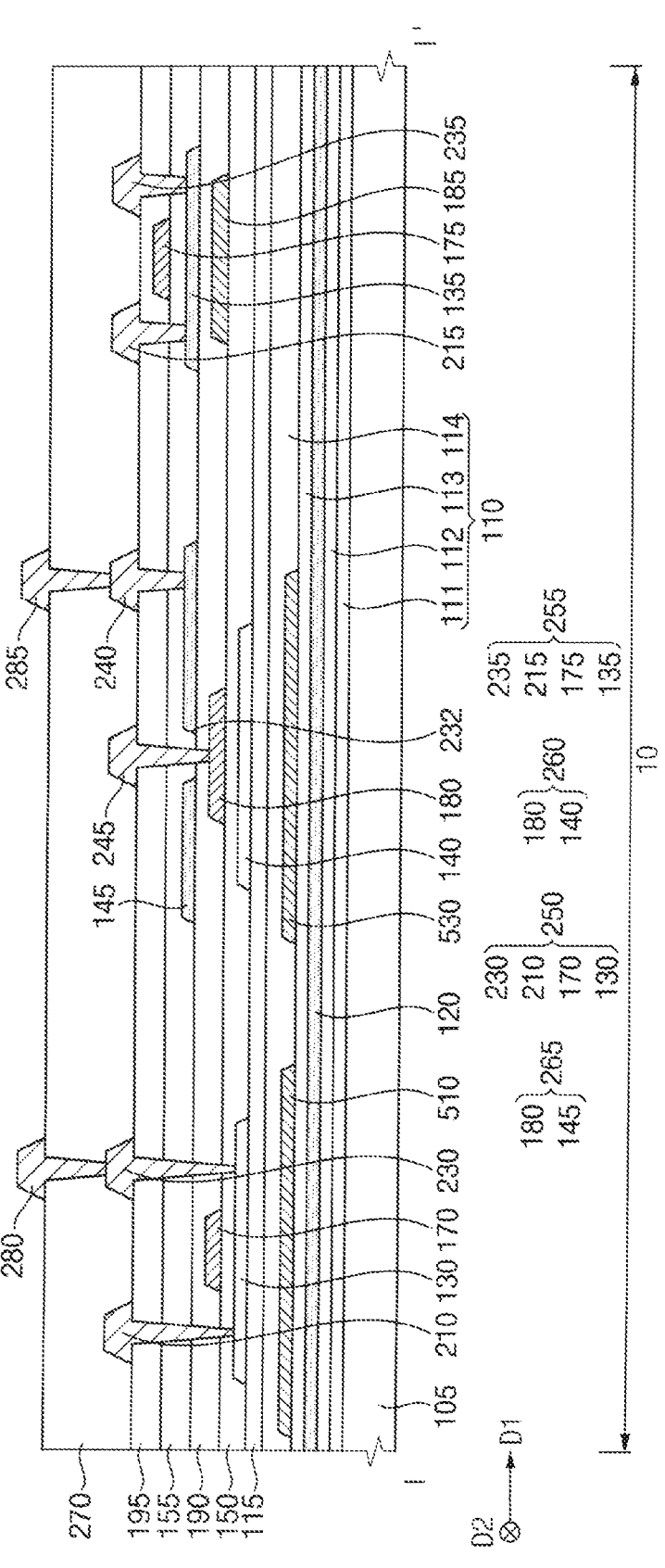

Referring to FIG. 14, the first planarization layer 270 may be formed on the second interlayer insulating layer 195, the first power supply electrode 245, the second power supply electrode 240, the second source electrode 215, the second drain electrode 235, the third source electrode 210, and the third drain electrode 230. The first planarization layer 270 may have a relatively thick thickness. In this case, the first planarization layer 270 may have a substantially flat top surface. In order to implement such a flat top surface of the first planarization layer 270, a planarization process may be additionally performed on the first planarization layer 270. The first planarization layer 270 may be formed by using an organic insulating material. For example, the first planarization layer 270 may include a photoresist, a polyacryl-based resin, a polyimide-based resin, a polyamide-based resin, a siloxane-based resin, an acryl-based resin, an epoxy-based resin, and the like. In the embodiments, a seventh contact hole that exposes a part of a top surface of the second power supply electrode 240 and an eighth contact hole that exposes a part of a top surface of the third drain electrode 230 may be formed in the first planarization layer 270 through a ninth mask process.

The power supply wire 285 may be formed on the first planarization layer 270. The power supply wire 285 may be connected to the second power supply electrode 240 through the seventh contact hole of the first planarization layer 270. The power supply wire 285 may be formed by using a metal, an alloy, metal nitride, conductive metal oxide, a transparent conductive material, and the like. These may be used alone or in combination with each other.

The connection electrode 280 may be formed on the first planarization layer 270 while being spaced apart from the power supply wire 285. The connection electrode 280 may be connected to the third drain electrode 230 through the eighth contact hole of the first planarization layer 270. In the embodiments, the connection electrode 280 and the power supply wire 285 may be simultaneously formed on the same layer by using the same material. For example, after a fifth preliminary metal layer is formed over the whole first planarization layer 270, the fifth preliminary metal layer may be partially etched through a tenth mask process, and the power supply wire 285 and the connection electrode 280 may be simultaneously formed on the first planarization layer 270.

Figure 15:
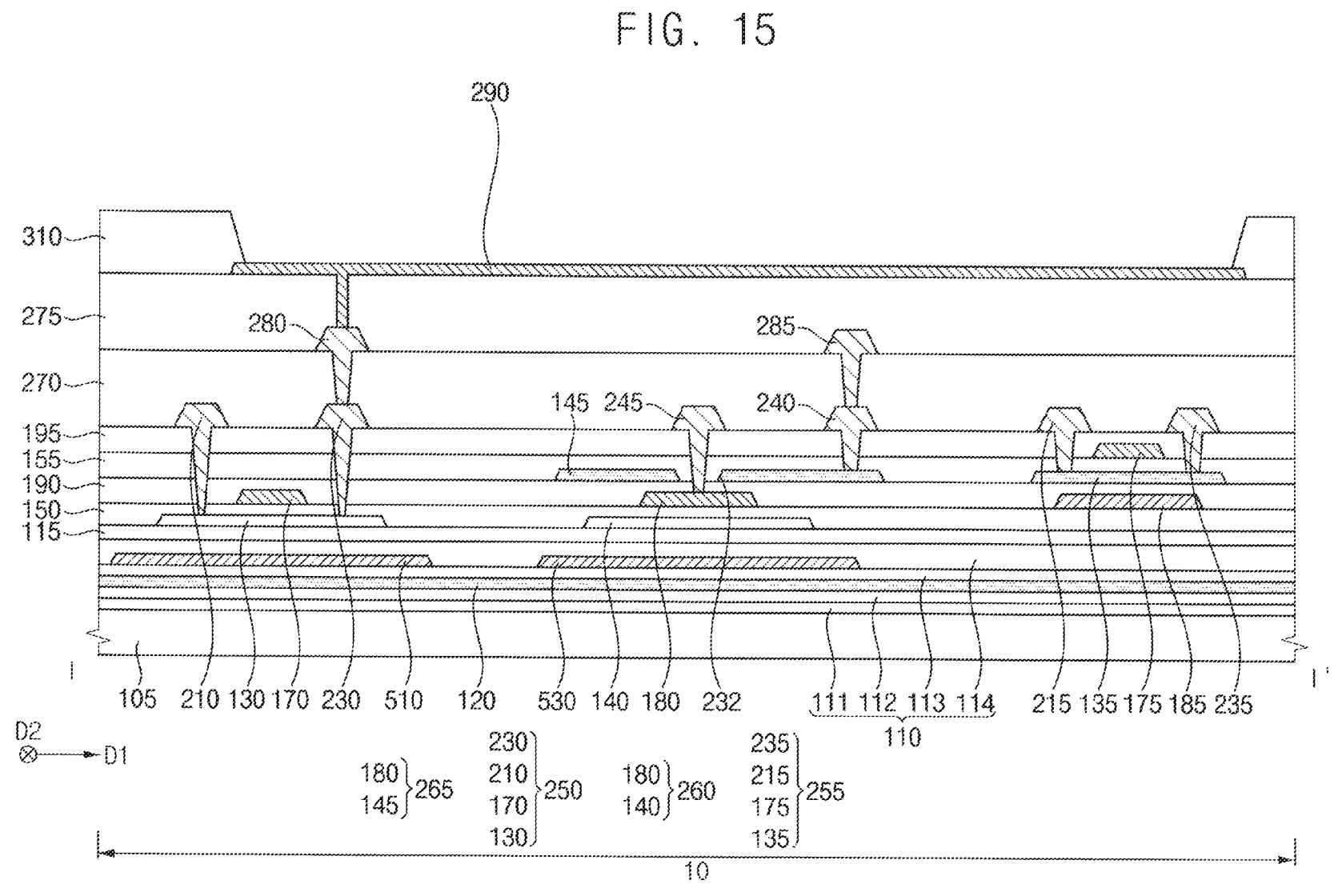

Referring to FIG. 15, the second planarization layer 275 may be formed on the first planarization layer 270, the power supply wire 285, and the connection electrode 280. The second planarization layer 275 may have a relatively thick thickness. In this case, the second planarization layer 275 may have a substantially flat top surface. In order to implement such a flat top surface of the second planarization layer 275, a planarization process may be additionally performed on the second planarization layer 275. The second planarization layer 275 may be formed by using an organic insulating material. In the embodiments, a ninth contact hole that exposes a part of a top surface of the connection electrode 280 may be formed in the second planarization layer 275 through an eleventh mask process.

The lower electrode 290 may be formed on the second planarization layer 275. The lower electrode 290 may be connected to the connection electrode 280 through the ninth contact hole of the second planarization layer 275. The lower electrode 290 may be formed by using a metal, an alloy, metal nitride, conductive metal oxide, a transparent conductive material, and the like. These may be used alone or in combination with each other. For example, after a sixth preliminary metal layer is formed over the whole second planarization layer 275, the sixth preliminary metal layer may be partially etched through a twelfth mask process, and the lower electrode 290 may be formed on the second planarization layer 275.

The pixel defining layer 310 may be formed on the second planarization layer 275 and a part of the lower electrode 290. In other words, the pixel defining layer 310 may expose a part of the lower electrode 290. The pixel defining layer 310 may be formed by using an organic insulating material. For example, after a preliminary pixel defining layer is formed over the whole of the second planarization layer 275 and the lower electrode 290, the preliminary pixel defining layer may be partially etched through a thirteenth mask process, and the pixel defining layer 310 that exposes a part of the lower electrode 290 may be formed.

Figure 16:
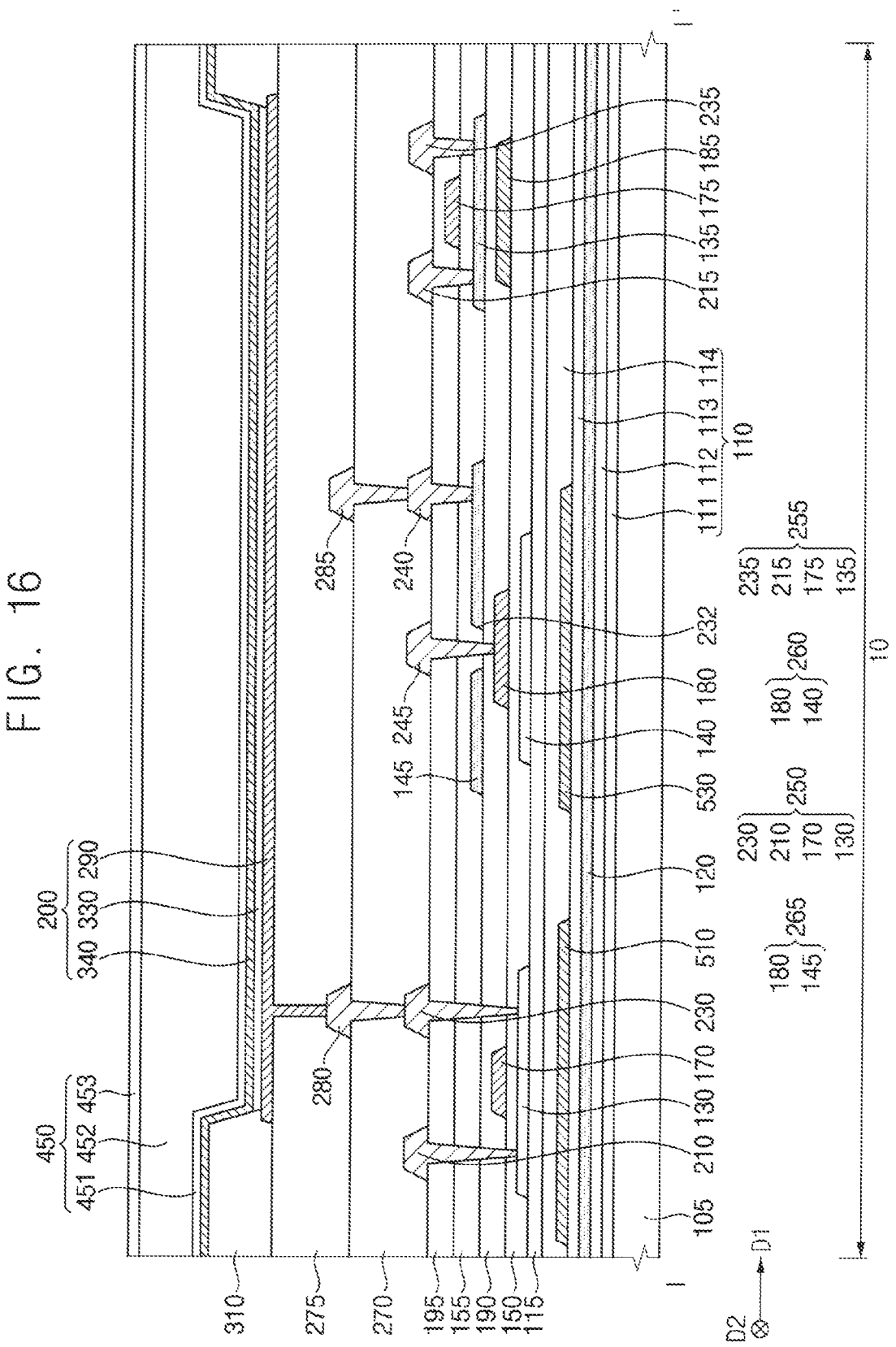

Referring to FIG. 16, the light emitting layer 330 may be formed on the lower electrode 290. The light emitting layer 330 may have a multilayer structure including the EML, the HIL, the HTL, the ETL, the EIL, and the like. The EML of the light emitting layer 330 may be formed by using at least one of light emitting materials for emitting different color lights according to the sub-pixels. Alternatively, the EML of the light emitting layer 330 may be formed by stacking a plurality of light emitting materials for generating different color lights such as a red light, a green light, and a blue light to emit a white light as a whole. In this case, a color filter may be formed on the light emitting layer 330 formed on the lower electrode 290. The color filter may include at least one of a red color filter, a green color filter, and a blue color filter. In some embodiments, the color filter may include a yellow color filter, a cyan color filter, and a magenta color filter. The color filter may be formed by using a photosensitive resin or a color photoresist.

The upper electrode 340 may be formed on the light emitting layer 330. The upper electrode 340 may be formed by using a metal, an alloy, metal nitride, conductive metal oxide, a transparent conductive material, and the like. These may be used alone or in combination with each other.

Accordingly, the light emitting structure 200 including the lower electrode 290, the light emitting layer 330, and the upper electrode 340 may be formed.

The first inorganic thin film encapsulation layer 451 may be formed on the upper electrode 340. For example, the first inorganic thin film encapsulation layer 451 may be formed along the profile of the upper electrode 340. The first inorganic thin film encapsulation layer 451 may be formed by using an inorganic insulating material having flexibility.

The organic thin film encapsulation layer 452 may be formed on the first inorganic thin film encapsulation layer 451. The organic thin film encapsulation layer 452 may be formed by using an organic insulating material having flexibility.

The second inorganic thin film encapsulation layer 453 may be formed on the organic thin film encapsulation layer 452. The second inorganic thin film encapsulation layer 453 may formed along the profile of the organic thin film encapsulation layer 452 with a uniform thickness to cover the organic thin film encapsulation layer 452. The second inorganic thin film encapsulation layer 453 may be formed by using an inorganic insulating material having flexibility.

Accordingly, the thin film encapsulation structure 450 including the first inorganic thin film encapsulation layer 451, the organic thin film encapsulation layer 452, and the second inorganic thin film encapsulation layer 453 may be formed.

After the thin film encapsulation layer 450 is formed, the glass substrate 105 may be removed from the substrate 110.

Referring to FIGS. 3 and 5, the lower structure 400 may be formed on the bottom surface of the substrate 110. The lower structure 400 may include an impact absorption layer disposed on the bottom surface of the substrate 110, a heat dissipation plate disposed under the impact absorption layer, an adhesive layer disposed between the impact absorption layer and the heat dissipation plate, and the like. The first opening 400a, the second opening 400b, and the third opening 400c may be formed in the lower structure 400.

Referring to FIG. 2, the first functional module 410 may be formed in the first opening 400a of the lower structure 400. The first functional module 410 may be a proximity sensor module or an infrared sensor module.

The second functional module 430 may be formed in the second opening 400b of the lower structure 400. The second functional module 430 may be a fingerprint recognition sensor module.

The third functional module 420 may be formed in the third opening 400c of the lower structure 400. The third functional module 420 may be a camera module.

Accordingly, the display device 100 shown in FIGS. 1 to 5 may be manufactured.

The inventive concepts may be applied to various electronic devices including a display device. For example, the present disclosure may be applied to numerous electronic devices such as vehicle-display devices, ship-display devices, aircraft-display devices, portable communication devices, exhibition display devices, information transfer display devices, medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate including a first polyimide layer, a first barrier layer, a second polyimide layer, and a second barrier layer, which are sequentially stacked;
a buffer layer on the substrate;
an amorphous silicon layer between the first barrier layer and the second polyimide layer;
a first light blocking layer between the second polyimide layer and the second barrier layer;
a driving transistor on the buffer layer under which the first light blocking layer is located, and including a first active layer including polysilicon and a first gate electrode disposed on the first active layer;
an upper capacitor electrode on the first gate electrode, the upper capacitor electrode being a metal oxide semiconductor and constituting a capacitor together with the first gate electrode;
a first switching transistor including a second active layer including a metal oxide semiconductor and spaced apart from the first active layer in a thickness direction and in a first direction intersecting the thickness direction, the first switching transistor further including a second gate electrode on the second active layer;
a lower electrode on the driving transistor and the first switching transistor;
a light emitting layer on the lower electrode;
an upper electrode on the light emitting layer;
a connection electrode directly connected to the lower electrode;
a second light blocking layer between the second polyimide layer and the second barrier layer and spaced apart from the first light blocking layer;
a second switching transistor including a third active layer on the second light blocking layer and a third gate electrode on the third active layer; and
a lower gate electrode under the second active layer and overlapping the second gate electrode, the lower gate electrode and the first gate electrode being coplanar and on a first same layer and including a first same material,
wherein the connection electrode directly connects a drain electrode of the second switching transistor to the lower electrode; and
wherein the upper capacitor electrode and the second active layer are coplanar and located on a second same layer, and include a second same material.

2. The display device of claim 1, wherein the upper capacitor electrode includes an opening that overlaps at least a part of the first gate electrode.

3. The display device of claim 2, further comprising:
an interlayer insulating layer on the upper capacitor electrode;
a first power supply electrode on the interlayer insulating layer; and
a second power supply electrode spaced apart from the first power supply electrode.

4. The display device of claim 3, wherein:
the first power supply electrode is connected to the first gate electrode through a first contact hole in a first portion of the interlayer insulating layer and passing through the opening of the upper capacitor electrode; and
the second power supply electrode is connected to the upper capacitor electrode through a second contact hole in a second portion of the interlayer insulating layer.

5. The display device of claim 1, wherein the substrate includes:
a first display area;
a second display area spaced apart from the first display area; and
a third display area surrounding the first and second display areas.

6. The display device of claim 5, further comprising a lower structure on a bottom surface of the substrate,
wherein the lower structure has first and second openings formed at portions overlapping the first and second display areas, respectively.

7. The display device of claim 6, wherein the first and second openings expose the bottom surface of the substrate overlapping the first and second display areas, respectively.

8. The display device of claim 6, wherein the lower structure includes an impact absorption layer, a heat dissipation plate, and an adhesive layer.

9. The display device of claim 6, further comprising:
a first functional module in the first opening of the lower structure; and
a second functional module disposed in the second opening of the lower structure.

10. The display device of claim 9, wherein the first functional module includes at least one of a camera module, a face recognition sensor module, a pupil recognition sensor module, an acceleration sensor module, a geomagnetic sensor module, a proximity sensor module, an infrared sensor module, or an illuminance sensor module.

11. The display device of claim 9, wherein the second functional module includes a fingerprint recognition sensor module.

12. The display device of claim 1, further comprising:

a planarization layer on the first and second switching transistors and the driving transistor;

a source electrode of the driving transistor directly connected to a bottom surface of the planarization layer;

a drain electrode of the driving transistor directly connected to the bottom surface of the planarization layer; and the first gate electrode of the driving transistor that is not directly connected to the planarization layer.

13. The display device of claim 12, further comprising:

an interlayer insulating layer on the upper capacitor electrode, wherein the interlayer insulating layer is between the source electrode of the driving transistor and the first gate electrode of the driving transistor and between the drain electrode of the driving transistor and the first gate electrode of the driving transistor to provide an electrical barrier between the drain electrode of the driving transistor and the first gate electrode of the driving transistor.

14. The display device of claim 1, wherein the third active layer and the first active layer are located on a same layer and include a same material.

15. The display device of claim 1, wherein the third gate electrode and the first gate electrode are located on a same layer and include a same material.

16. The display device of claim 1, further comprising a thin film encapsulation structure on the upper electrode, wherein the thin film encapsulation structure includes:

a first inorganic thin film encapsulation layer;

an organic thin film encapsulation layer on the first inorganic thin film encapsulation layer; and a second inorganic thin film encapsulation layer on the organic thin film encapsulation layer.

* * * * *